US006844982B2

(12) United States Patent
Omura

(10) Patent No.: US 6,844,982 B2
(45) Date of Patent: Jan. 18, 2005

(54) PROJECTION OPTICAL SYSTEM, EXPOSURE SYSTEM PROVIDED WITH THE PROJECTION OPTICAL SYSTEM, AND EXPOSURE METHOD USING THE PROJECTION OPTICAL SYSTEM

(75) Inventor: Yasuhiro Omura, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/421,737

(22) Filed: Apr. 24, 2003

(65) Prior Publication Data

US 2004/0004771 A1 Jan. 8, 2004

(30) Foreign Application Priority Data

Apr. 26, 2002 (JP) ......................................... 2002-125506

(51) Int. Cl.[7] .................................................. G02B 3/00
(52) U.S. Cl. ............................. 359/649; 359/651; 349/5
(58) Field of Search ................................ 359/649, 650, 359/651, 618; 349/5, 7, 8, 10

(56) References Cited

U.S. PATENT DOCUMENTS

| 6,097,546 | A | * | 8/2000 | Yoshii et al. ................ 359/649 |
| 6,137,626 | A | | 10/2000 | Takaoka |
| 6,201,634 | B1 | | 3/2001 | Sakuma et al. |
| 6,239,924 | B1 | | 5/2001 | Watson et al. |
| 6,366,404 | B1 | | 4/2002 | Hiraiwa et al. |
| 6,400,516 | B1 | | 6/2002 | Spinali |
| 2003/0000453 | A1 | | 1/2003 | Unno et al. |
| 2003/0011893 | A1 | | 1/2003 | Shiraishi et al. |
| 2003/0011896 | A1 | | 1/2003 | Shiraishi |
| 2003/0012724 | A1 | | 1/2003 | Burnett et al. |
| 2003/0021026 | A1 | | 1/2003 | Allan et al. |
| 2003/0025894 | A1 | | 2/2003 | Owa et al. |
| 2003/0086171 | A1 | | 2/2003 | McGuire, Jr. |
| 2003/0053036 | A1 | | 3/2003 | Fujishima et al. |
| 2003/0058421 | A1 | | 3/2003 | Omura et al. |
| 2003/0086071 | A1 | | 5/2003 | McGuire, Jr. |
| 2003/0086156 | A1 | | 5/2003 | McGuire, Jr. |
| 2003/0086157 | A1 | | 5/2003 | McGuire, Jr. |
| 2003/0099047 | A1 | | 5/2003 | Hoffman et al. |
| 2003/0137733 | A1 | | 7/2003 | Gerhard et al. |

FOREIGN PATENT DOCUMENTS

| EP | 1 114 802 A1 | 7/2001 |
| JP | A 8-107060 | 4/1996 |
| JP | A 11-54411 | 2/1999 |
| JP | A 2000-331927 | 11/2000 |
| JP | A 2001-76992 | 3/2001 |
| JP | A 2001-284226 | 10/2001 |
| WO | WO 02/093209 A2 | 11/2002 |
| WO | WO 02/093257 A2 | 11/2002 |
| WO | WO 03/009021 A1 | 1/2003 |
| WO | WO 03/009062 A1 | 1/2003 |
| WO | WO 03/077007 A2 | 9/2003 |
| WO | WO 03/077011 A1 | 9/2003 |

OTHER PUBLICATIONS

Burnett et al., "Intrinsic Birefringence in 157 nm Materials," 2nd International Symposium on 157 nm Lithography on May 15, 2001.

Nattermann et al., "Birefringence of $CaF_2$," International SEMATECH Calcium Fluoride Birefringence Work Shop on Jul. 2001.

Burnett et al., "Intrinsic birefringence in calcium fluoride and barium fluoride," Physical Review B, vol. 64 241102(R), Nov. 29, 2002.

* cited by examiner

Primary Examiner—Hung X. Dang
(74) Attorney, Agent, or Firm—Oliff & Berridge, PLC

(57) ABSTRACT

A projection optical system includes a plurality of light-transmissive members and projects an image of a first surface onto a second surface. The projection optical system includes a light-transmissive crystal member made of crystal material. At least one of the light-transmissive crystal members satisfies 0.3<ED/LD<0.95

Where an clear aperture diameter of the light-transmissive crystal member is denoted by ED and an outside diameter of the light-transmissive crystal member is denoted by LD.

25 Claims, 13 Drawing Sheets

Fig.1
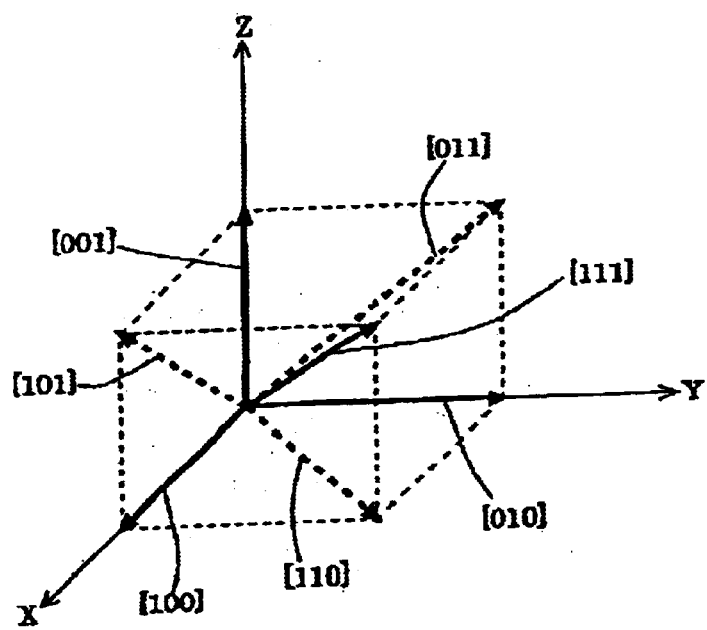
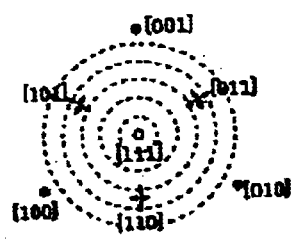
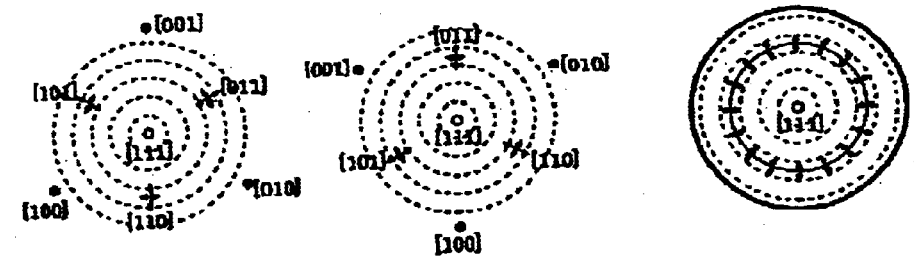
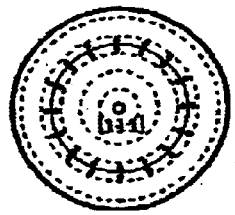
Fig.2A  Fig.2B  Fig.2C

PROJECTION OPTICAL SYSTEM, EXPOSURE SYSTEM PROVIDED WITH THE PROJECTION OPTICAL SYSTEM, AND EXPOSURE METHOD USING THE PROJECTION OPTICAL SYSTEM

BACKGROUND OF THE INVENTION

1. Field of the Invention

The present invention relates to a projection optical system and an exposure system provided with the projection optical system, and more particularly, to a projection optical system suitable for an exposure system used when microdevices including semiconductor devices are manufactured using a photolithography process.

2. Related Background of the Invention

In recent years, miniaturization has been further advancing in semiconductor device manufacture and semiconductor chip-mounted substrate manufacture. In exposure systems for printing patterns, projection optical systems having higher resolutions have come to be demanded. In order to satisfy such demand for higher resolutions, the wavelength of exposure light (radiation) must be shortened and, at the same time, NA (numerical aperture of a projection optical system) must be enlarged. However, if the wavelength of exposure light is shortened, the types of optical glass capable of being practically used are limited because of light absorption.

For example, when vacuum ultraviolet light having a wavelength of 200 nm or less, particularly $F_2$ laser light (wavelength: 157 nm) is used as exposure light, there is no other choice but to use fluoride crystals including calcium fluoride (fluorite, $CaF_2$) and barium fluoride ($BaF_2$), as light-transmissive optical material constituting a projection optical system in many cases. Practically, the projection optical system is basically presumed to be formed of only fluorite in a design of an exposure apparatus using $F_2$ laser light as the exposure light. It was considered that fluorite was a crystal belonging to the cubic system and optically isotropic, and practically had no birefringence. Moreover, in conventional experiments using visible light, only small birefringence (random one due to internal stresses) was observed for fluorite.

However, in a symposium on lithography held on May 15, 2001 (2nd International Symposium on 157 nm Lithography), John H. Burnett et al. of US NIST presented that they experimentally and theoretically confirmed the existence of intrinsic birefringence in fluorite.

According to this presentation, birefringence in fluorite is approximately zero in the direction of the crystal axis [111] and the directions of its equivalent crystal axes [-111], [1-11], [11-1], and in the direction of the crystal axis [100] and the directions of its equivalent crystal axes [010] and [001], but has practically nonzero values in the other directions. In particular, in the six directions of the crystal axes [110], [-110], [101], [-101], [011], and [01-1], fluorite has a birefringence of up to 6.5 nm/cm for a wavelength of 157 nm and a birefringence of up to 3.6 nm/cm for a wavelength of 193 nm.

These birefringence values are essentially larger than the 1 nm/cm, which is regarded as a permissible value for random birefringence. Moreover, there is a possibility that the influence of birefringence could be accumulated through a plurality of lenses because of the nonrandom distribution. In the conventional art, since the birefringence of fluorite is not taken into consideration in the design of projection optical systems, and the crystal axis [111] and the optical axis are coincided from the standpoint of ease in machining in general. In this case, the NA (numerical aperture) is relatively large in a projection optical system, and consequently, light beams inclined in a certain degree from the crystal axis [111] also pass through the lenses. As a result, the image-forming performance may be deteriorated due to the influence of birefringence.

An object of the present invention is to provide a projection optical system having a favorable optical performance without being practically influenced by birefringence even if optical material having birefringence (particularly, intrinsic birefringence), such as fluorite, is used. Moreover, another object of the present invention is to provide an exposure system and an exposure method capable of performing projection and exposure with high resolution and high precision using the projection optical system of the present invention which has a favorable optical performance without being practically influenced by birefringence.

SUMMARY OF THE INVENTION

In order to achieve the above-described objects, a first aspect of the present invention provides a projection optical system which includes a plurality of light-transmissive members and which projects an image of a first surface onto a second surface. The projection optical system includes a light-transmissive crystal member made of crystal material and that at least one of the light-transmissive crystal members satisfies $$0.3 < ED/LD < 0.95$$

where an clear aperture diameter of the light-transmissive crystal member is denoted by ED and an outside diameter of the light-transmissive crystal member is denoted by LD.

In a preferable mode of the first aspect of the present invention, the light-transmissive crystal member is made of crystal material belonging to a cubic system (an isometric system) and is formed such that an optical axis and any one of crystal axes [100] and [110] of the light-transmissive crystal member approximately coincide.

In a preferable mode of the first aspect of the present invention, the light-transmissive crystal member is made of fluorite and is formed such that an optical axis and a crystal axis [100] of the light-transmissive crystal member approximately coincide.

In a preferable mode of the first aspect of the present invention, an edge thickness of the light-transmissive crystal member is 5 mm or more at the outside diameter.

In order to achieve the above-described objects, a second aspect of the present invention provides a projection optical system which includes a plurality of light-transmissive members and which projects an image of a first surface onto a second surface. The projection optical system includes a fluorite member made of fluorite. The fluorite member is formed such that an optical axis and a crystal axis [100] of the fluorite member approximately coincide. Moreover, the projection optical system has a feature that the outside diameters XD and D1 satisfy $$0.1 < D1/XD < 0.8$$

where an outside diameter of the light-transmissive member having a maximum outside diameter, among all the light-transmissive members included in the projection optical system, is denoted by XD and an outside diameter of the fluorite member having a maximum outside diameter, among the fluorite members, is denoted by D1.

In order to achieve the above-described objects, a third aspect of the present invention provides a projection optical system which includes a plurality of light-transmissive members and which projects an image of a first surface onto a second surface. The projection optical system includes a fluorite member made of fluorite. The fluorite member is formed such that an optical axis and a crystal axis [110] of the fluorite member approximately coincide. Moreover, the projection optical system has a feature that the outside diameters XD and D2 satisfy $$0.1 < D2/XD < 0.8$$

where an outside diameter of the light-transmissive member having a maximum outside diameter, among all the light-transmissive members included in the projection optical system, is denoted by XD and an outside diameter of the fluorite member having a maximum outside diameter, among the fluorite members, is denoted by D2.

In order to achieve the above-described objects, a fourth aspect of the present invention provides a projection optical system which includes a plurality of light-transmissive members and which projects an image of a first surface onto a second surface. The projection optical system includes a fluorite member made of fluorite. The fluorite member is formed such that an optical axis and a crystal axis [100] of the fluorite member approximately coincide. Moreover, the projection optical system has a feature that, among the fluorite members, more than or equal to 70% of all the fluorite members are located in vicinities of pupil positions of the projection optical system.

In a favorable mode of the fourth aspect of the present invention, the fluorite members include: a first fluorite member formed such that an optical axis and a crystal axis [100] of the first fluorite member approximately coincide; and a second fluorite member formed such that an optical axis and a crystal axis [100] of the second fluorite member approximately coincide. Moreover, the first and second fluorite members are positioned such that crystal axes different from the crystal axes [100] are relatively rotated by 45° about the optical axes.

In order to achieve the above-described objects, a fifth aspect of the present invention provides a projection optical system which includes a plurality of light-transmissive members and which projects an image of a first surface onto a second surface. The projection optical system includes a fluorite member made of fluorite. The fluorite member is formed such that an optical axis and a crystal axis [110] of the fluorite member approximately coincide. Moreover, the projection optical system has a feature that, among the fluorite members, more than or equal to 70% of all the fluorite members are located in vicinities of pupil positions of the projection optical system.

In a favorable mode of the fifth aspect of the present invention, the fluorite members includes: a first fluorite member formed such that an optical axis and a crystal [110] of the first fluorite member approximately coincide; and a second fluorite member formed such that an optical axis and a crystal axis [110] of the second fluorite member approximately coincide. Moreover, the first and second fluorite members are positioned such that crystal axes different from the crystal axes [110] are relatively rotated by 90° about the optical axes.

A sixth aspect of the present invention provides an exposure system including: an illumination system for illuminating a mask set in the first surface; and the projection optical system of any one of the first to fifth aspects of the present invention, the projection optical system being for forming an image of a pattern formed on the mask onto a photosensitive substrate set in the second surface.

A seventh aspect of the present invention provides a method of exposure including: illuminating a mask set in the first surface; and projecting and exposing an image of a pattern formed on the mask onto a photosensitive substrate set in the second surface through the projection optical system of any one of the first to fifth aspects of the present invention.

Incidentally, in the present invention, the outside diameter of a light-transmissive crystal member or a light-transmissive member means an outside diameter including a portion provided when the light-transmissive crystal member or the light-transmissive member is held. For example, in such a case where a protrusion portion (ridge portion) for retaining the light-transmissive crystal member or the light-transmissive member is provided at the periphery of the light-transmissive crystal member or the light-transmissive member, the outside diameter is considered including the protrusion portion (ridge portion).

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 1 is a view explaining the crystal axis orientations in fluorite.

FIGS. 2A to 2C are views explaining the method of Burnett et al., and show the distribution of birefringence in terms of the incident angle of a light beam.

DESCRIPTION OF THE PREFERRED EMBODIMENT

Figure 3A:
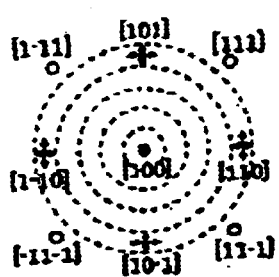
FIGS. 3A to 3C are views explaining a first method proposed by the applicant of the present application, and show the distribution of birefringence in terms of the incident angle of a light beam.

FIG. 1 is a view explaining the crystal axis orientations of fluorite. Referring to FIG. 1, the crystal axes of fluorite are defined based on the XYZ coordinate system of the cubic system (isometric system). Specifically, the crystal axis [100] is defined along the +X axis, the crystal axis [010] is defined along the +Y axis, and the crystal axis [001] is defined along the +Z axis.

Moreover, the crystal axis [101] is defined in the direction forming an angle of 45° with the crystal axes [100] and [001] in the XZ plane. The crystal axis [110] is defined in the direction forming an angle of 45° with the crystal axes [100] and [010] in the XY plane. The crystal axis [011] is defined in the direction forming an angle of 45° with the crystal axes [010] and [001] in the YZ plane. Furthermore, the crystal axis [111] is defined in the direction forming the same acute angle with the +X, +Y, and +Z axes.

Although only the crystal axes in the space which is defined by the +X, +Y, and +Z axes are shown in FIG. 1, the crystal axes are also defined in other space similarly. As mentioned previously, in fluorite, birefringence is approximately zero (minimum) in the direction of the crystal axis [111] depicted by a solid line in FIG. 1 and the directions of the crystal axes [−111], [1−11], and [11−1] (not shown) equivalent thereto.

Similarly, birefringence also is approximately zero (minimum) in the directions of the crystal axes [100], [010], and [001] depicted by solid lines in FIG. 1. On the other hand, birefringence is maximum in the directions of the crystal axes [110], [101], and [011] depicted by broken lines in FIG. 1 and the directions of the crystal axes [−110], [−101], and [01−1] (not shown) equivalent thereto.

Incidentally, Burnett et al. have disclosed a method of reducing the influence of birefringence in the aforementioned presentation. FIGS. 2A to 2C are views explaining the method of Burnett et al. and show the distribution of indices of birefringence with respect to the incident angle of a light beam (angle between a light beam and an optical axis). In FIGS. 2A to 2C, five concentric circles depicted by broken lines in the drawings indicate 10° per division. Therefore, the innermost circle indicates the area of an incident angle of 10° with respect to the optical axis, and the outermost circle indicates the area of an incident angle of 50° with respect to the optical axis.

In addition, the closed marks indicate areas having no birefringence and relatively high refractive indices, and the open marks indicate areas having no birefringence and relatively low refractive indices. On the other hand, the thick circle and the long double-headed arrows indicate the directions of relatively high refractive indices in areas having birefringence, and the thin circle and the short double-headed arrows indicate the directions of relatively low refractive indices in areas having birefringence. The above-described notation is also adopted in FIG. 3 mentioned later.

In the method of Burnett et al., the crystal axes [111] and the optical axis are coincided in a pair of fluorite lenses (lenses made of fluorite), and the pair of fluorite lenses are rotated approximately 60° relative to each other about the optical axis. Therefore, the distribution of indices of birefringence in one fluorite lens is as shown in FIG. 2A, and the distribution of indices of birefringence in the other fluorite lens is as shown in FIG. 2B. As a result, the distribution of indices of birefringence in the pair of fluorite lenses as a whole is as shown in FIG. 2C.

In this case, referring to FIGS. 2A and 2B, the area corresponding to the crystal axis [111], which coincides with the optical axis, becomes an area having no birefringence and a relatively low refractive index. Moreover, the areas corresponding to the crystal axes [100], [010], and [001] become areas having no birefringence and relatively high refractive indices. Furthermore, the areas corresponding to the crystal axes [110], [101], and [011] become birefringent areas having relatively low refractive indices for tangentially polarized light and relatively high refractive indices for radially polarized light. Thus, in each fluorite lens, it is clear that that the influence of birefringence is maximum in the area of 35.26° (angle between the crystal axes [111] and [110]) from the optical axis.

On the other hand, referring to FIG. 2C, it is clear that the influences on the crystal axes [110], [101], and [011], where birefringence is maximum, are attenuated in the pair of fluorite lenses as a whole by rotating the pair of fluorite lenses by 60° relative to each other. As a result, in the area of 35.26° from the optical axis, there remains a birefringent area having a lower refractive index of tangentially polarized light than the refractive index of radially polarized light. In other words, the influence of birefringence can be significantly reduced by using the method of Burnett et al., though the distribution having rotational symmetry of the optical axis remains.

Meanwhile, the applicant of the present application has proposed a first method for reducing the influence of birefringence by the following manner: In a pair of light-transmissive crystal members (e.g., fluorite lenses) made of crystal material belonging to the cubic system, the crystal axes [100] (or crystal axes optically equivalent to the crystal axes [100]) and the optical axis are coincided, and the pair of light-transmissive crystal members are rotated by approximately 45° relative to each other about the optical axis. Here, the crystal axes optically equivalent to the crystal axes [100] are the crystal axes [010] and [001].

Figure 3B:
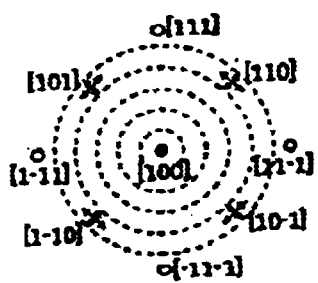
Figure 3C:
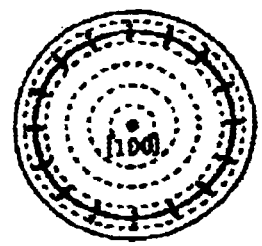

FIGS. 3A to 3C are views explaining the above-described first method and show the distribution of indices of birefringence with respect to the incident angle of a light beam (angle between a light beam and an optical axis). In this method of the present invention, the distribution of indices of birefringence in one fluorite lens is as shown in FIG. 3A, and the distribution of indices of birefringence in the other fluorite lens is as shown in FIG. 3B. As a result, the distribution of indices of birefringence in the pair of fluorite lenses as a whole is as shown in FIG. 3C.

Referring to FIGS. 3A and 3B, in the first method, the area corresponding to the crystal axis [100], which coincides with the optical axis, becomes an area having no birefringence and a relatively high refractive index. Moreover, the areas corresponding to the crystal axes [111], [1-11], [−11-1], and [11-1] become areas having no birefringence and relatively low refractive indices. Furthermore, the areas corresponding to the crystal axes [101], [10-1], [110], and [1-10] become birefringent areas having relatively high refractive indices for tangentially polarized light and relatively low refractive indices for radially polarized light. Thus, in each fluorite lens, it is clear that the influence of indices of birefringence is maximum in the area of 45° (angle between the crystal axes [100] and [101]) from the optical axis.

On the other hand, referring to FIG. 3C, the influences on the crystal axes [101], [10-1], [110], and [1-10], where birefringence is maximum, are significantly attenuated in the pair of fluorite lenses as a whole by rotating the pair of fluorite lenses by 45° relative to each other. As a result, in the area of 45° from the optical axis, there remains a birefringent area having a higher refractive index for tangentially polarized light than the refractive index for radially polarized light. In other words, the influence of birefringence can be significantly reduced by using this method of the present invention, though the distribution having rotational symmetry of the optical axis remains.

Incidentally, in the first method, "rotating one fluorite lens and the other fluorite lens by approximately 45° relative to each other about the optical axis" means that the relative angle about the optical axis between predetermined crystal axes (e.g., the crystal axes [010], [001], [011], or [01-1]), which are directed toward a direction different from the optical axis, in one fluorite lens and the other fluorite lens is approximately 45°. To be more precise, for example, the relative angle about the optical axis between the crystal axis [010] in one fluorite lens and the crystal axis [010] in the other fluorite lens is approximately 45°.

In addition, as apparent from FIGS. 3A and 3B, when the crystal axes [100] are used as the optical axis, rotational asymmetry in the influence of birefringence about the optical axis appears with a period of 90°. Therefore, in this method of the present invention, "being rotated by approximately 45° relative to each other about the optical axis" means that being rotated by approximately 45°+(n×90°) relative to each other about the optical axis, that is, being rotated by 45°, 135°, 225°, 315° and so on relative to each other (here, n is an integer).

On the other hand, in the method of Burnett et al., "rotating one fluorite lens and the other fluorite lens by approximately 60° relative to each other about the optical axis" means that the relative angle about the optical axis between predetermined crystal axes (for example, the crystal axes [−111], [11-1], or [1-11]), which are directed toward a direction different from the optical axis, in one fluorite lens and the other fluorite lens is approximately 60°. To be more precise, for example, the relative angle about the optical axis between the crystal axis [−111] in one fluorite lens and the crystal axis [−111] in the other fluorite lens is approximately 60°.

In addition, as apparent from FIGS. 2A and 2B, when the crystal axes [111] are used as the optical axis, rotational asymmetry in the influence of birefringence about the optical axis appears with a period of 120°. Therefore, in the method of Burnett et al., "being rotated by approximately 60° relative to each other about the optical axis" means that being rotated by approximately 60°+(n×120°) relative to each other about the optical axis, that is, being rotated by 60°, 180°, 300°, or the like relative to each other (here, n is an integer).

Moreover, the applicant of the present application has proposed a second method. In this second method, the crystal axes [110] (or crystal axes optically equivalent to the crystal axes [110]) and the optical axis of a pair of light-transmissive crystal members (e.g., fluorite lenses) made of crystal material belonging to the cubic system are coincided, and the pair of light-transmissive crystal members are rotated by approximately 90° relative to each other about the optical axis, thus reducing the influence of birefringence. Here, the crystal axes optically equivalent to the crystal axes [110] are the crystal axes [−110], [101], [−101], [011], and [01-1].

Figure 4A:
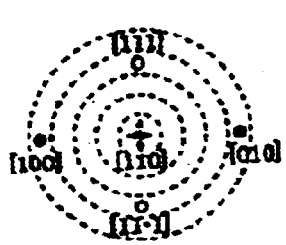
FIGS. 4A to 4C are views explaining a second method proposed by the applicant of the present application, and show the distribution of birefringence in terms of the incident angle of a light beam.
Figure 4B:
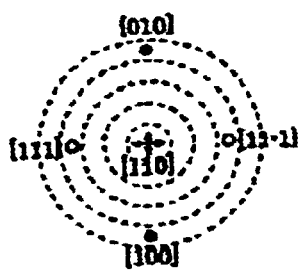
Figure 4C:
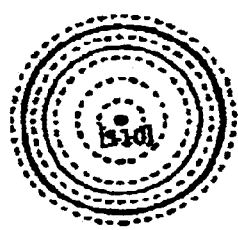

FIGS. 4A to 4C are views explaining the above-described second method and show the distribution of indices of birefringence with respect to the incident angle of a light beam. In the second method, the distribution of indices of birefringence in one fluorite lens is as shown in FIG. 4A, and the distribution of indices of birefringence in the other fluorite lens is as shown in FIG. 4B. As a result, the distribution of indices of birefringence in the pair of fluorite lenses as a whole is as shown in FIG. 4C Referring to FIGS. 4A and 4B, in the second method, the area corresponding to the crystal axis [110], which coincides with the optical axis, becomes a birefringent area having a relatively high refractive index for polarized light in one direction and a relatively low refractive index for polarized light in the other direction (direction orthogonal to the other direction). The areas corresponding to the crystal axes [100] and [010] become areas having no birefringence and relatively high refractive indices. Furthermore, the areas corresponding to the crystal axes [111] and [11-1] become areas having no birefringence and relatively low refractive indices.

On the other hand, referring to FIG. 4C, the influences on the crystal axes [110], where birefringence is at the maximum, are almost eliminated in the pair of fluorite lenses as a whole by rotating the pair of fluorite lenses by 90° relative to each other. As a result, the vicinity of the optical axis becomes an area having no birefringence and an average refractive index. Specifically, by using the second method proposed in the present invention, a favorable image-forming performance can be ensured without being practically influenced by birefringence.

Incidentally, in the second method, "rotating one fluorite lens and the other fluorite lens by approximately 90° relative to each other about the optical axis" means that the relative angle about the optical axis between predetermined crystal axes (e.g., the crystal axes [001], [−111], [−110], or [1-11]), which are directed toward a direction different from the optical axis, in one fluorite lens and the other fluorite lens is approximately 90°. To be more precise, for example, the relative angle about the optical axis between the crystal axis [001] in one fluorite lens and the crystal axis [001] in the other fluorite lens is approximately 90°.

In addition, as apparent from FIGS. 4A and 4B, when the crystal axes [110] are used as the optical axis, rotational asymmetry in the influence of birefringence about the optical axis appears with a period of 180°. Therefore, in the second method proposed in the present invention, "being rotated by approximately 90° relative to each other about the optical axis" means that being rotated by approximately 90°+(n×180°) relative to each other about the optical axis, that is, being rotated by 90°, 270° and so on relative to each other (here, n is an integer).

As the above description, the influence of birefringence can be significantly reduced by any one of the followings: allowing the crystal axes [111] and the optical axis of a pair of light-transmissive crystal members made of crystal material belonging to the cubic system to coincide and rotating the pair of light-transmissive crystal members made of crystal material belonging to the cubic system by 60° relative to each other about the optical axis; allowing the crystal axes [100] and the optical axis of a pair of light-transmissive crystal members made of crystal material belonging to the cubic system to coincide and rotating the pair of light-transmissive crystal members made of crystal material belonging to the cubic system by 45° relative to each other about the optical axis; or allowing the crystal axes [110] and the optical axis of a pair of light-transmissive crystal members made of crystal material belonging to the cubic system to coincide and rotating the pair of light-transmissive crystal members made of crystal material belonging to the cubic system by 90° relative to each other about the optical axis.

Here, directions are opposite between the rotationally symmetric distribution remaining when a pair of light-transmissive crystal members made of crystal material belonging to the cubic-system are rotated by 60° relative to each other in the state where the crystal axes [111] and the optical axis thereof are coincided and the rotationally symmetric distribution remaining when a pair of light-transmissive crystal members made of crystal material belonging to the cubic system are rotated by 45° relative to each other in the state where the crystal axes [100] and the optical axis thereof are coincided. In other words, the fast axis in a pair of light-transmissive crystal members made of crystal material belonging to the cubic system, which are rotated by 60° relative to each other in the state where the crystal axes [111] and the optical axis are coincided (hereinafter, such a pair is hereinafter referred to as a "light-transmissive crystal member pair of crystal axis [111]") is orthogonal to the fast axis in a pair of light-transmissive crystal members made of crystal material belonging to the cubic system, which are rotated by 45° relative to each other in the state where the crystal axes [100] and the optical axis are coincided (hereinafter, such a pair is referred to as a "light-transmissive crystal member pair of crystal axis [100]").

In yet other words, in a light-transmissive crystal member pair of crystal axis [100], there remains the distribution of birefringence having the fast axis in the radial direction, and, in a light-transmissive crystal member pair of crystal axis [111], there remains the distribution of birefringence having the fast axis in the tangential direction. Incidentally, when birefringence exists in a sample, the phases of two orthogonal linearly polarized light components in a vibration plane (polarized light plane) passing through the sample changes due to the difference in refractive index. Specifically, with respect to one polarized light component, the phase of the other polarized light component is advanced or delayed. The polarized light direction of the advanced phase is called the fast axis, and the polarized light direction of the delayed phase is called the slow axis.

Thus, it is clear that the influence of birefringence can be more favorably reduced by combining a light-transmissive crystal member pair of crystal axis [111], in which a pair of light-transmissive crystal members are rotated by 60° relative to each other in the state where the crystal axes [111] and the optical axis thereof are coincided, and a light-transmissive crystal member pair of crystal axis [100], in which a pair of light-transmissive crystal members are rotated by 45° relative to each other in the state where the crystal axes [100] and the optical axis thereof are coincided.

Meanwhile, when crystal material belonging to the cubic system is used as optical material for a light-transmissive member, strain (birefringence) due to stress (typically internal stresses) thereof may deteriorate the image-forming performance of a projection optical system comprising this light-transmissive material. It has been clarified that, in particular, when a light-transmissive member in which a crystal axis different from the crystal axis [111] and the optical axis are coincided, strain (birefringence) due to internal stresses thereof remarkably appears.

Figure 5:
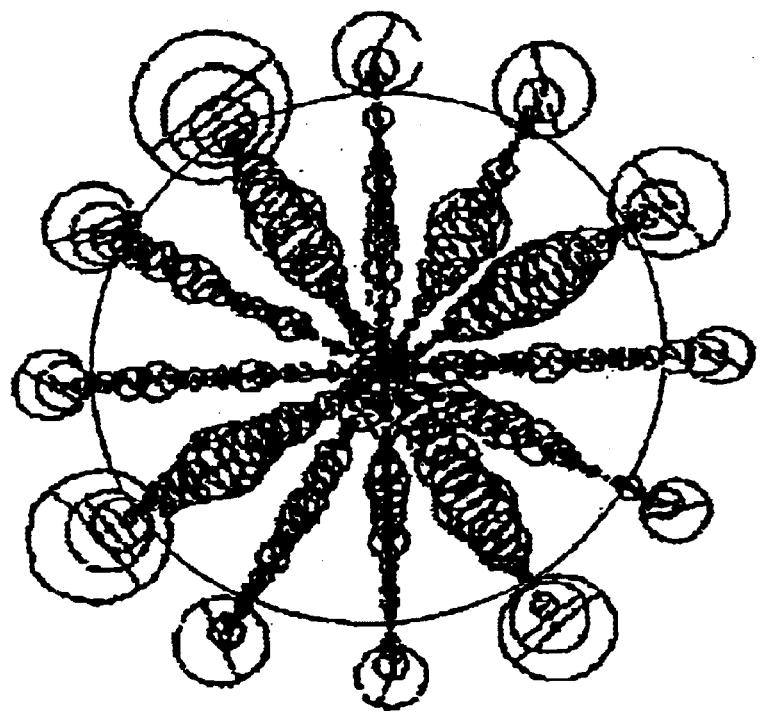
FIG. 5 is a view showing the phase map of a light-transmissive crystal member in which a crystal axis, except the crystal axis [111], and the optical axis are coincided.

FIG. 5 is a view showing the phase map of a light-transmissive crystal member of crystal axis [100]. The in-plane direction of FIG. 5 corresponds to the in-plane direction of a plane orthogonal to the optical axis of the light-transmissive crystal member of crystal axis [100]. In FIG. 5, the sizes of circles indicate the degrees of strain (birefringence), and chords indicate the orientations of fast axes.

Referring to the phase map of FIG. 5, it is clear that strain (birefringence) at the outermost portion is significantly large in a light-transmissive crystal member having a crystal axis of [100]. Note that, though not shown, strain (birefringence) at the outermost portion is also significantly large in a light-transmissive crystal member having a crystal axis of [110].

Accordingly, in the present invention, at least one of light-transmissive crystal members is made to satisfy $$0.3 < ED/LD < 0.95 \tag{1}$$

where the clear aperture diameter of a light-transmissive crystal member is denoted by ED, and the outside diameter of the light-transmissive crystal member is denoted by LD.

Here, when light passing through the light-transmissive crystal member is assumed, the clear aperture diameter ED of a light-transmissive crystal member indicates the diameter of the area where the light passes. Moreover, the outside diameter of a light-transmissive crystal member or a light-transmissive member indicates the outside diameter including a portion provided when the light-transmissive crystal member or the light-transmissive member is held.

Figure 6A:
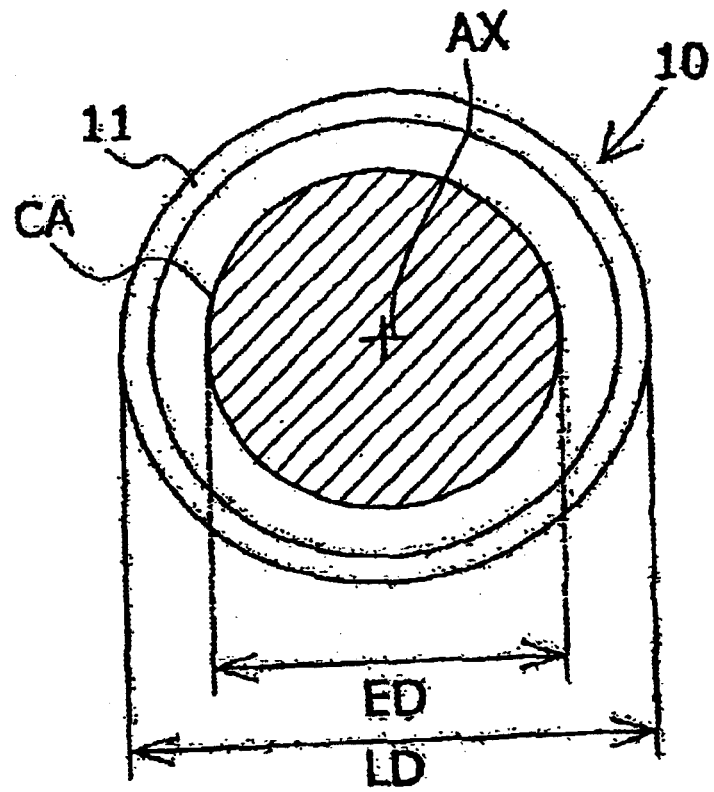
FIGS. 6A and 6B are views for explaining an outside diameter in the present invention.
Figure 6B:
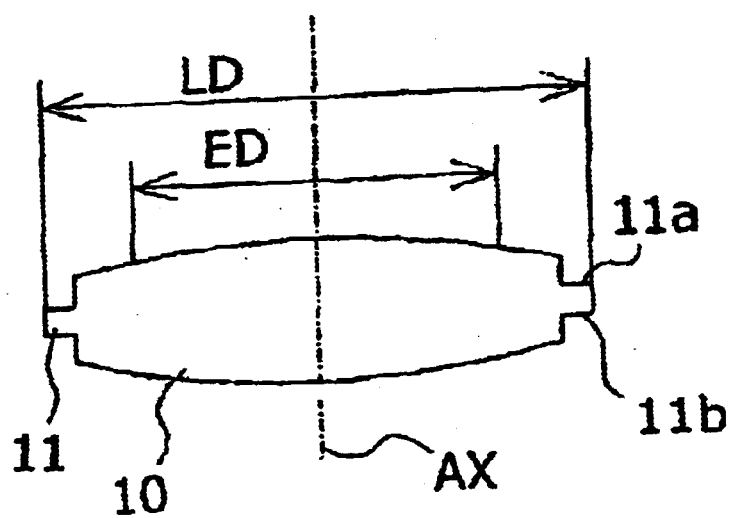
Figure 7:
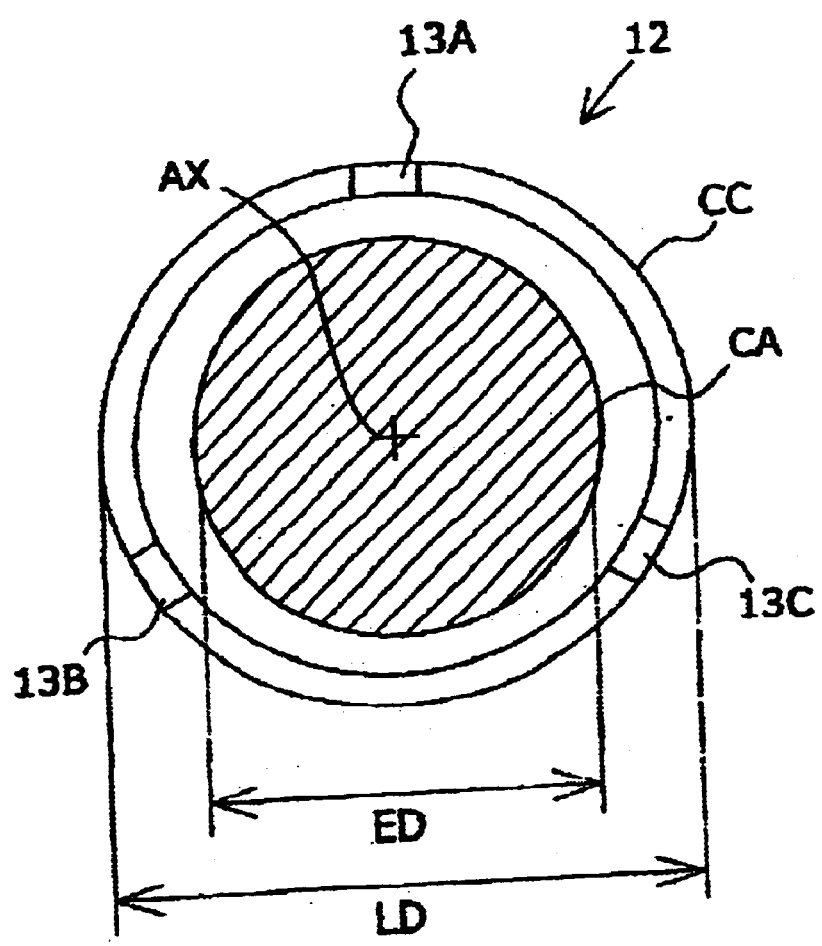
FIG. 7 is a view for explaining an outside diameter in the present invention.

Referring to FIGS. 6A and 6B and FIG. 7, a detailed description is given. Note that, in the description below, a description is given for the case where a light-transmissive crystal member is a lens having a predetermined refractive power.

FIG. 6A is a top view of a lens 10 viewed from the direction of the optical axis AX, and FIG. 6B is a meridional cross-sectional view (cross section including the optical axis AX) of the lens 10. The lens 10 shown in FIGS. 6A and 6B has a ridge portion 11 provided at the peripheral portion of the lens 10 to be held and fastened with a holding (retaining) member at a portion except at the lens surface (not shown). As shown in FIG. 6B, this ridge portion (protrusion portion) 11 has parallel surfaces 11a and 11b, and the lens 10 is held by fastening these surfaces 11a and 11b with the holding member.

In FIG. 6A, the area CA where a bundle of rays passing through the lens 10 occupies is represented by hatching, and the diameter of this area CA is the clear aperture diameter ED. Here, when the area CA has a noncircular shape, the circumscribed circle of the noncircular area CA is assumed to regard the diameter of this circumscribed circle as the clear aperture diameter ED. In addition, the outside diameter LD of the lens 10 is the diameter of the ridge portion 11.

Moreover, as shown in FIG. 7, which is a top view of the lens 12 viewed from the direction of the optical axis AX, when the lens 12 has not a ridge portion over the whole circumference of the lens but a plurality of ridge portions 13A to 13C arranged with approximately equal angles in the peripheral portion of the lens, the circumscribed circle CC of the plurality of ridge portions 13A to 13C is assumed to regard the diameter of this circumscribed circle as the outside diameter LD.

A structure for retaining such ridge portions in the peripheral portion of a lens is disclosed, for example, in Japanese Unexamined Patent Publication No. 2001-74991 (corresponding to U.S. Pat. No. 6,239,924), Japanese Unexamined Patent Publication No. 2001-76992, Japanese Unexamined Patent Publication No. 2001-284226, Japanese Unexamined Patent Publication No. 2002-107595 (corresponding to U.S. Pat. No. 6,400,516), and the like by the applicant of the present application. The disclosures in the above-mentioned U.S. patents, as well as the Japanese Patent applications published in the Official Gazette for Laid-Open Patent Applications are incorporated herein by reference.

Incidentally, when a method of retaining the circumference of the lens with a retaining ring or the like is adopted, the diameter of the lens is the outside diameter LD.

Moreover, when the cross-sectional shape of the lens in a plane orthogonal to the optical axis is noncircular, the circumscribed circle of the outer shape of the lens is assumed to set the diameter of this circumscribed circle as the outside diameter LD.

When the ratio ED/LD exceeds the upper limit of the above-described conditional condition (1), light is transmitted through an area having a significantly high strain (birefringence). Accordingly, the image-forming performance of a projection optical system due to this strain (birefringence) is deteriorated significantly. This situation is not preferable. Note that, in order to further improve the image-forming performance of a projection optical system, it is preferable to set the upper limit of the above-described conditional condition (1) to 0.9.

When the ratio ED/LD is lower than the lower limit of the above-described conditional condition (1), the image-forming performance of a projection optical system is improved. However, the outside diameter of the light-transmissive crystal member for ensuring a necessary clear aperture diameter becomes extremely large, thus raising costs for forming the light-transmissive crystal member or the light-transmissive crystal member becomes unavailable. This situation is not preferable. Note that, in order to further lower costs for a light-transmissive crystal member, it is preferable to set the lower limit of the above-described conditional condition (1) to 0.4.

Moreover, in a light-transmissive crystal member made of crystal material belonging to the cubic system, a disadvantage such as a crack is apt to occur at the retained (held) portion when the light transmissive crystal member is held. Accordingly, in the case where the outside diameter is kept larger than the clear aperture diameter as defined by the above-described conditional condition (1), the edge thickness at the outermost portion of the light-transmissive crystal member (thickness of the light-transmissive crystal member at the outermost portion in the direction of the optical axis) is preferably kept so as to be 5 mm or larger.

Figure 8:
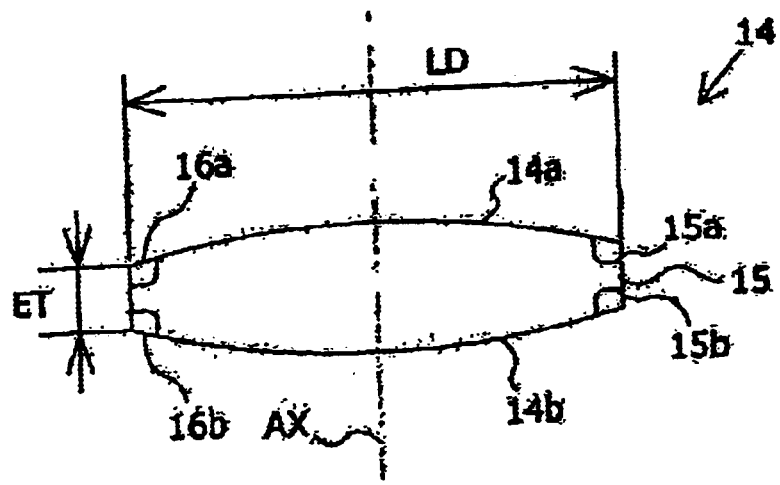
FIG. 8 is a view for explaining an edge thickness in the present invention.

For example, as shown in FIG. 8, in the case where a ridge portion or portions 15 (one ridge portion over the whole circumference or a plurality of ridge portions) are provided at the outermost portion of the lens 14, virtual extended surfaces 16a and 16b of two lens surfaces 14a and 14b of the lens 14 are assumed, and the distance between the extended surfaces 16a and 16b at the position of the outside diameter LD in the direction of the optical axis AX is defined as an edge thickness ET.

Particularly in the case where the ridge portion 15 is provided at the peripheral portion of the lens as shown in FIG. 8, the ridge portion and the lens 14 are monolithically formed by grinding the peripheral portion of the lens in many cases. In this case, in order to prevent a crack in the ridge portion 15, it is preferable to perform "R" machining for rolling the corner between the ridge portion 15 and the lens 14. However, in the case where the edge thickness ET is lower than 5 mm and extremely small, such "R" machining cannot be performed, or a sufficient thickness of the ridge portion 15 in the direction of the optical axis AX (distance between the parallel surfaces 15a and 15b) cannot be ensured. Accordingly, when the ridge portion 15 is held, a crack is apt to occur therein.

Incidentally, also in the case where a method of retaining the peripheral portion of the lens with a retaining ring or the like is adopted, the thickness of a portion retained with the retaining ring (peripheral portion of the lens) in the direction of the optical axis AX becomes extremely thin. Accordingly, a crack is apt to occur in the lens due to retention with the retaining ring.

Meanwhile, as in the above-described first and second methods, in the case where a crystal axis except the crystal axis [111] and an optical axis are coincided to try to reduce the influence of birefringence, such as the case where a light-transmissive crystal member having the crystal axis [100] or [110] and the optical axis coincided, the amount of birefringence increases in proportion to the aperture of the light-transmissive crystal material. Accordingly, it is preferable to adopt such a light-transmissive crystal member as a light-transmissive member having a relatively small aperture in a projection optical system.

Specifically, a case where a projection optical system including a fluorite member formed so that the crystal axis [100] and the optical axis are approximately coincided is assumed, it is preferable to satisfy $$0.1 < D1/XD < 0.8 \tag{2}$$

where the outside diameter of the light-transmissive member having the maximum outside diameter among all the light-transmissive members included in the projection optical system is denoted by XD, and the outside diameter of the fluorite member having the maximum outside diameter among the fluorite members included therein is denoted by 1.

When the ratio D1/XD exceeds the upper limit of the above-described conditional condition (2), birefringence due to a fluorite member having the crystal axis [100] as the optical axis has an extremely large adverse influence on the image-forming performance of a projection optical system. This situation is not preferable. On the other hand, when the ratio D1/XD is lower than the lower limit of the conditional condition (2), the effect of reducing the influence of birefringence by a fluorite member having the crystal axis [100] as the optical axis becomes extremely low. This situation is not preferable. In addition, when the ratio D1/XD is lower than the lower limit of the conditional condition (2), the energy of the light passing through a fluorite member having the crystal axis [100] as the optical axis is extremely concentrated, thus causing irradiation variation (variation in image-forming performance due to light irradiation). This situation is not preferable.

Moreover, a case where a projection optical system including a fluorite member formed so that the crystal axis [110] and the optical axis are coincided, it is preferable to satisfy $$0.1 < D2/XD < 0.8 \tag{3}$$

where the outside diameter of the light-transmissive member having the maximum outside diameter among all the light-transmissive members included in the projection optical system is denoted by XD, and the outside diameter of the fluorite member having the maximum outside diameter among the fluorite members included therein is denoted by D2.

When the ratio D2/XD exceeds the upper limit of the above-described conditional condition (3), birefringence due to a fluorite member having the crystal axis [110] as the optical axis has an extremely large adverse influence on the image-forming performance of a projection optical system. This situation is not preferable. On the other hand, when the ratio D2/XD is lower than the lower limit of the conditional condition (3), the effect of reducing the influence of birefringence by a fluorite member having the crystal axis [110] as the optical axis becomes extremely low. This situation is not preferable. In addition, when the ratio D2/XD is lower than the lower limit of the conditional condition (3), the energy of the light passing through a fluorite member having the crystal axis [110] as the optical axis is extremely concentrated, thus causing irradiation variation (variation in image-forming performance due to light irradiation). This situation is not preferable.

Meanwhile, as previously mentioned, the intrinsic birefringence in a light-transmissive crystal member (e.g., a lens, plane parallel plates, or the like) which is made of crystal material belonging to the cubic system and in which a crystal axis except the crystal axis [111] and the optical axis are coincided depends on the incident angle to this light-transmissive crystal member (the intrinsic birefringence differs depending on the incident angle). In addition, strain (birefringence) due to internal stresses in the above-described light-transmissive crystal member depends on the position in this light-transmissive member (strain (birefringence) differs depending on the position where light passes through the light-transmissive member in a plane orthogonal to the optical axis) Therefore, in a light-transmissive crystal member in which a crystal axis except the crystal axis [111] and the optical axis are coincided and which is located in the vicinity of the first surface or a plane (including the second surface) optically conjugate to the first surface, it is difficult to simultaneously correct both of strain (birefringence) due to the intrinsic birefringence and strain (birefringence) due to stresses (typically internal stress). Thus, variation of the image-forming performance in the image field of a projection optical system is apt to be caused.

Accordingly, a light-transmissive crystal member having a crystal axis, except the crystal axis [111], as the optical axis is preferably placed in the vicinity of a pupil. Incidentally, even if the amount of birefringence has a position dependency in the vicinities of pupils, birefringence almost evenly influences the image-forming performance anywhere in the entire image field of a projection optical system. Therefore, the overall influence on the image-forming performance can be easily corrected by other correction means.

Here, a case where a projection optical system including a fluorite member formed so that the crystal axis [100] and the optical axis approximately coincide is assumed, more than or equal to 70% of total number of the fluorite members are preferably placed in the vicinities of the pupil positions of the projection optical system.

Moreover, a case where a projection optical system including a fluorite member formed so that the crystal axis [110] and the optical axis approximately coincide is assumed, fluorite members of which number is 70% or more of the total number of fluorite members are preferably placed in the vicinities of the pupil positions of the projection optical system.

Figure 9:
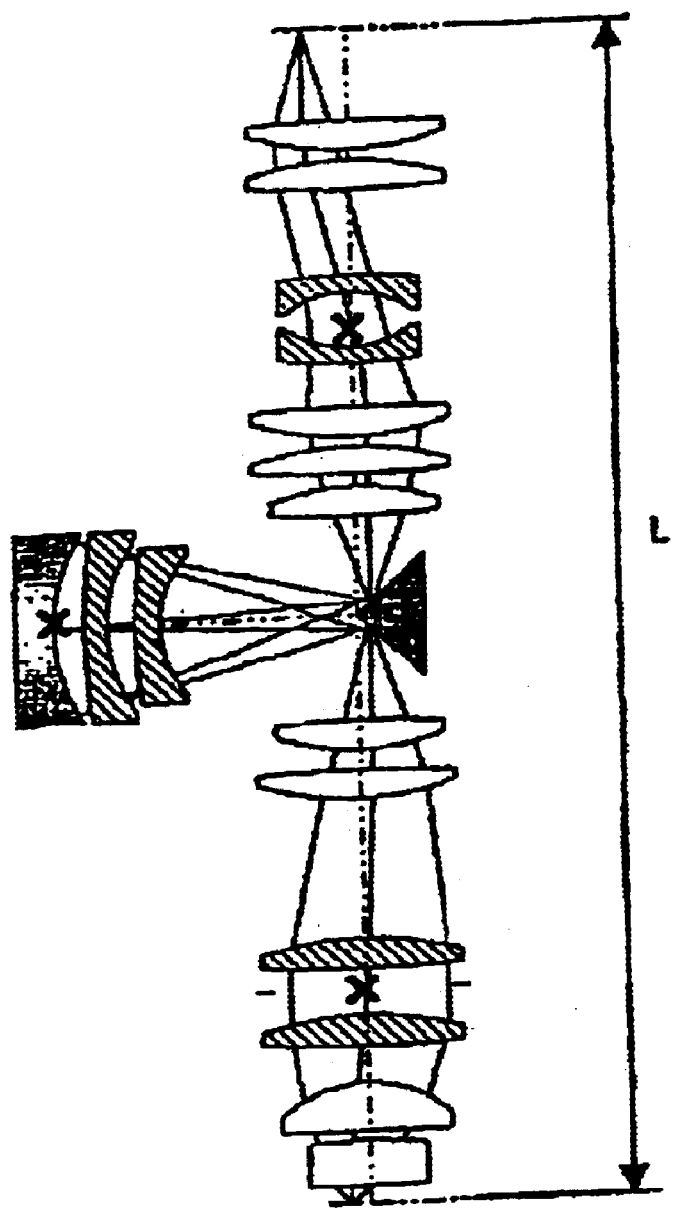
FIG. 9 is a view for explaining the vicinities of pupils in the present invention.

Incidentally, the vicinity of a pupil in the present invention means the range where the distance from the pupil position is within ±0.12 L. Here, as shown in FIG. 9, the distance from the first surface to the second surface of a projection optical system is denoted by L, and the position where the principal ray intersects the optical axis, at the outermost portion of the exposure area, is defined as a pupil position (indicated by the marks "x" in FIG. 9).

Here, when the number of fluorite members which are placed in the vicinities of the above-described pupil positions and which are formed so that the crystal axis [100] or [110] and the optical axis approximately coincide is lower than 70% of the total number of fluorite members, the number of fluorite members which have crystal axes, except the crystal axes [111], and which is placed in the vicinities of the first surface and a plane optically conjugate to the first surface becomes extremely large. Accordingly, it is difficult to simultaneously correct the intrinsic birefringence and strain (birefringence) due to internal stresses and to correct variation of the image-forming performance in the image field of a projection optical system.

Here, when fluorite members include a first fluorite member formed so that the crystal axis [100] and the optical axis approximately coincide and a second fluorite member formed so that the crystal axis [100] and the optical axis approximately coincide, the first and second fluorite members are preferably positioned so that crystal axes different from the crystal axes [100] are rotated by 45° relative to each other about the optical axis.

On the other hand, when fluorite members include a first fluorite member formed so that the crystal axis [110] and the optical axis approximately coincide and a second fluorite member formed so that the crystal axis [110] and the optical axis approximately coincide, the first and second fluorite members are preferably positioned so that crystal axes different from the crystal axes [110] may be rotated by 90° relative to each other about the optical axis.

As shown in the aforementioned FIG. 5, it is clear that strain (birefringence) due to internal stresses in a light-transmissive crystal member having the crystal axis [100] or [110] as the optical axis shows a distribution with four-fold symmetry in the light-transmissive crystal member and depends on the crystal axis orientation. Therefore, similar to the correction of intrinsic birefringence described above, for fluorite members having the crystal axes [100] as the optical axes, the distribution of strain (birefringence) can be made to be a distribution with rotational symmetry by setting the relative rotation angle of a pair of fluorite members to 45° about the optical axis. On the other hand, for fluorite members having the crystal axes [110] as the optical axes, the distribution of strain (birefringence) can be made to be a distribution with rotational symmetry by setting the relative rotation angle of a pair of fluorite members to 90° about the optical axis. Thus, it is possible to reduce the deterioration in the image-forming performance of a projection optical system.

An embodiment of the present invention will be described based on accompanying drawings.

Figure 10:
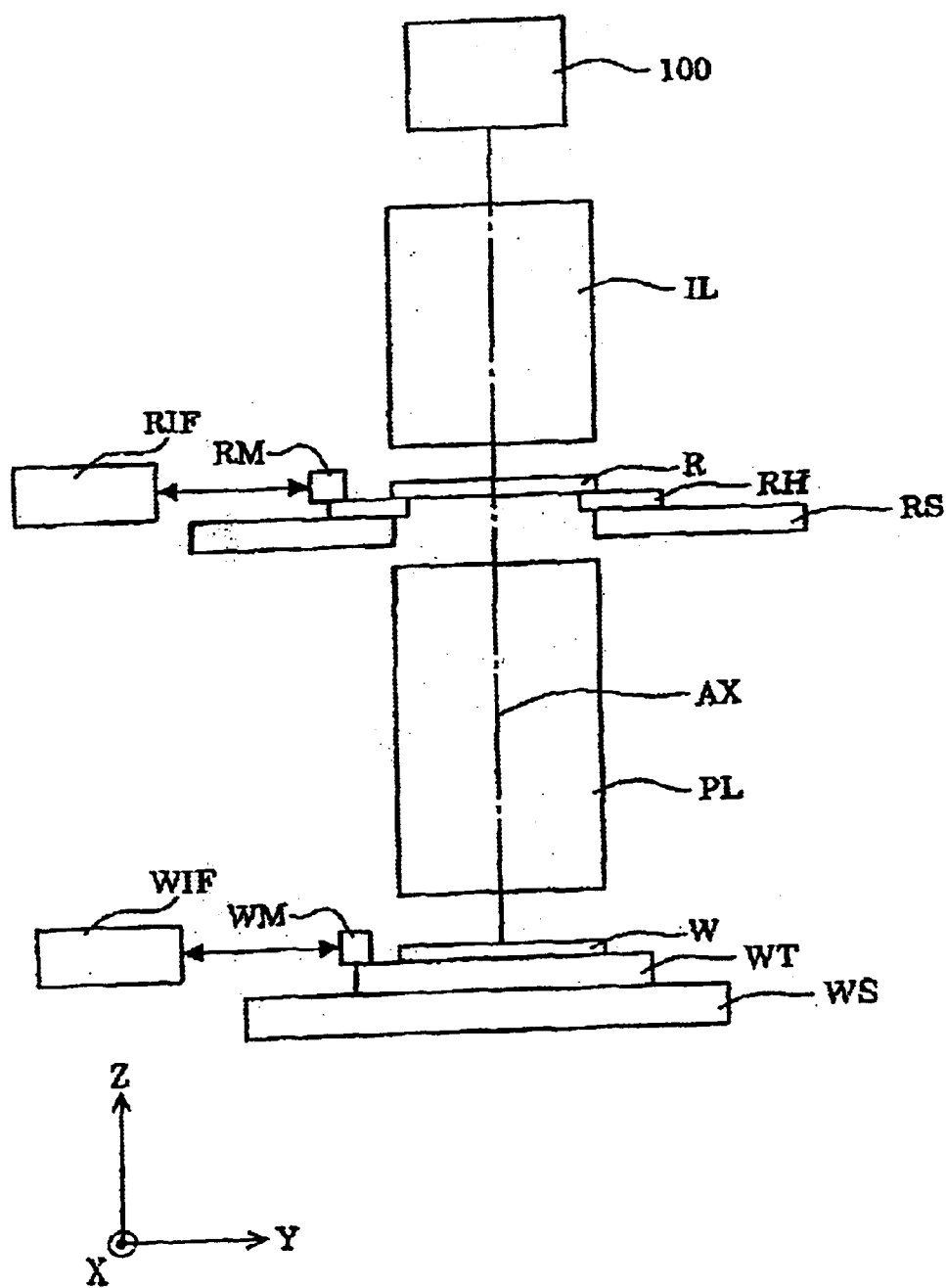
FIG. 10 is a view schematically showing the configuration of an exposure system provided with a projection optical system according to an embodiment of the present invention.

FIG. 10 is a view schematically showing the configuration of an exposure system comprising a projection optical system according to the embodiment of the present invention. Note that, in FIG. 10, the Z axis is defined parallel to a reference optical axis AX of the projection optical system PL. In addition, in a plane perpendicular to the reference optical axis AX, the Y axis is defined parallel to the in-plane direction of FIG. 10, and the X axis is defined perpendicular to the in-plane direction of FIG. 10.

The shown exposure system is provided with, for example, a $F_2$ laser light source (oscillation center wavelength: 157.6244 nm) serving as a light source 100 for supplying illumination light in ultraviolet area.

Light emitted from the light (radiation) source 100 evenly illuminates a reticle R having a predetermined pattern (typically, a circuit pattern) formed thereon through an illumination optical system IL. Here, the optical path between the light source 100 and the illumination optical system IL is sealed in a casing (not shown). The space from the light source 100 to the optical member disposed closest to a reticle in the illumination optical system IL is filled with inert gas, such as helium gas or nitrogen, which has a low absorptance for exposure light, or is practically maintained in a vacuum state.

The reticle R is held on a reticle stage RS with a reticle holder RH interposed therebetween parallel to the XY plane. On the reticle R, a pattern to be transferred is formed. Among the whole pattern area, a rectangular (slit-shaped) pattern area having a long side along the X direction and a short side along the Y direction is illuminated. The reticle stage RS is constituted so that it can be two-dimensionally moved along the reticle plane (i.e., XY plane) by the action of a drive system (not shown) and that the position coordinates thereof may be measured and controlled by an interferometer RIF using a reticle moving mirror RM.

Through the projection optical system PL, light from the pattern formed on the reticle R forms a reticle pattern image on a wafer W which is a photosensitive substrate. The wafer W is held on a wafer stage WS with a wafer table (wafer holder) WT interposed therebetween parallel to the XY plane. In addition, to optically correspond to the rectangular illuminated area on the reticle R, a pattern image is formed in a rectangular exposure area having a long side along the X direction and a short side along the Y direction on the wafer W. The wafer stage WS is constituted so that it can be two-dimensionally moved along the wafer plane (i.e., XY plane) by the action of a drive system (not shown) and that the position coordinates thereof may be measured and controlled by an interferometer WIF using a wafer moving mirror WM.

Figure 11:
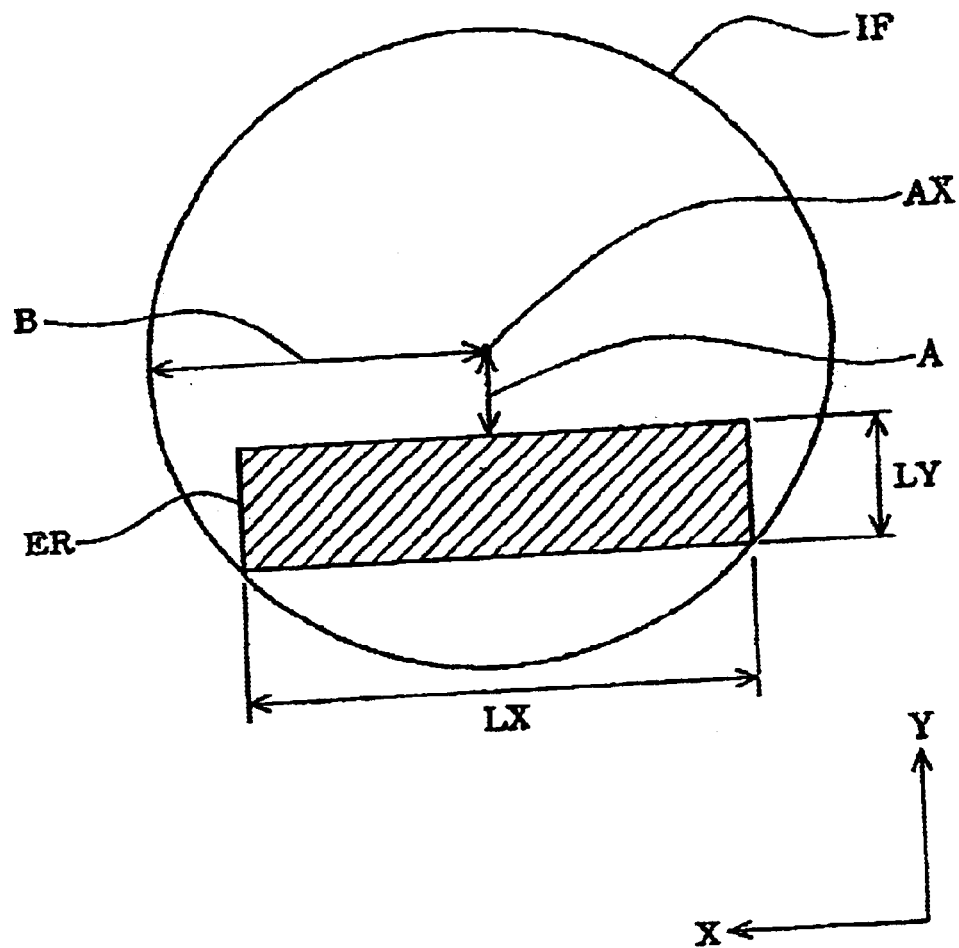
FIG. 11 is a view showing the positional relationship between a rectangular exposure area (i.e., effective exposure area) formed on a wafer and a reference optical axis.

FIG. 11 is a view showing the positional relationship between the rectangular exposure area (i.e., effective exposure area) formed on the wafer and the reference optical axis. As shown in FIG. 11, in an example of the present embodiment, within a circular area (image circle) IF having the reference optical axis AX as the center and a radius B, a rectangular effective exposure area ER having a desired size is set at the position apart from the reference optical axis AX by an off-axis (off-axial) amount A in the −Y direction. Here, the length of the effective exposure area ER in the X direction is LX, and the length thereof in the Y direction is LY.

In other words, in the example, a rectangular effective exposure area ER having a desired size is set at the position apart from the reference optical axis AX in the −Y direction by an off-axis amount A, and the radius B of a circular image circle IF is defined to include the effective exposure area ER using the reference optical axis AX as the center. Accordingly, corresponding to this, on a reticle R, a rectangular illuminated area (i.e., effective illuminated area), though not shown, having size and shape corresponding to those of the effective exposure area ER is formed at the position apart from the reference optical axis AX by a distance corresponding to the off-axis amount A in the −Y direction.

Moreover, the shown exposure system is constituted so that the inside of the projection optical system PL is maintained in an airtight (gastight) state between the optical member (lens L11 in the example) placed closest to the reticle and the optical member (lens L313 in the example) placed closest to the wafer among the optical members constituting the projection optical system PL. The gas inside the projection optical system PL is filled with inert gas, such as helium gas or nitrogen, or is practically maintained in a vacuum state.

Furthermore, in the narrow optical path between the illumination optical system IL and the projection optical system PL, the reticle R, the reticle stage RS and the like are arranged. The inside of a casing (not shown) which hermetically seals the reticle R, the reticle stage RS, and the like is filled with inert gas, such as nitrogen or helium gas, or is practically maintained in a vacuum state.

Moreover, in the narrow optical path between the projection optical system PL and the wafer W, the wafer W, the wafer stage WS, and the like are arranged. The inside of a casing (not shown) which hermetically seals the wafer W, the wafer stage WS, and the like is filled with inert gas, such as nitrogen or helium gas, or is practically maintained in a vacuum state. Thus, an atmosphere in which exposure light is hardly absorbed is formed over the entire optical path from the light source 100 to the wafer W.

As described above, the illuminated area on the reticle R and the exposure area (i.e., effective exposure area ER) on the wafer W which are defined by the projection optical system PL have a rectangular shape having a short side along the Y direction. Therefore, on the wafer W, the reticle pattern is scanned and exposed for an area having a width equivalent to the long side of the exposure area and a length corresponding to the scanned (swept) amount (moved amount) of the wafer W by synchronously moving (scanning or sweeping) the reticle stage RS and the wafer stage WS as well as the reticle R and the wafer W in the same direction (i.e., in the same orientation) along the direction of the short sides of the rectangular exposed and illuminated areas, that is, the Y direction while controlling the positions of the reticle R and the wafer W using the drive systems, the interferometers (RIF and WIF), and the like.

In the example of the present embodiment, the projection optical system PL comprises a first image-forming system G1 of a dioptric (refractive) type for forming a first (primary) intermediate image of a pattern of a reticle R placed in a first surface, a second image-forming system G2 which includes a concave reflection mirror CM and two negative lenses and which is for forming a second (secondary) intermediate image at the unit magnification to that of the first intermediate image (at the same time, the second intermediate image is the secondary image of the reticle pattern), and a third image-forming system G3 of a refractive type for forming a final image (demagnified image of the reticle pattern) of the reticle pattern on the wafer W placed in a second surface based on the light from the second intermediate image.

Incidentally, in the example, a first optical path folding (bending) mirror M1 for deflecting the light from the first image-forming optical system G1 toward the second image-forming optical system G2 is disposed in the vicinity of the position where the first intermediate image is formed in the optical path between the first and second image-forming optical systems G1 and G2. In addition, a second optical path bending mirror M2 for deflecting the light from the second image-forming optical system G2 toward the third image-forming optical system G3 is disposed in the vicinity of the position where the second intermediate image is formed in the optical path between the second and third image-forming optical systems G2 and G3.

Moreover, in the example, the first image-forming system G1 has an optical axis AX1 extending linearly, and the third image-forming system G3 has an optical axis AX3 extending linearly. The optical axes AX1 and AX3 are set so as to coincide with a reference optical axis AX which is the common single optical axis. The optical axes Ax1 and AX3 are coaxial. Here, the reference optical axis AX is positioned along the gravity direction (i.e., vertical direction). As a result, the reticle R and the wafer W are arranged parallel to each other along a plane (i.e., horizontal plane) orthogonal to the gravity direction. In addition, all the lenses constituting the first image-forming optical system G1 and all the lenses constituting the third image-forming optical system G3 are also arranged along the horizontal plane in the reference optical axis AX.

Meanwhile, the second image-forming optical system G2 has an optical axis AX2 extending linearly. This optical axis AX2 is set orthogonally to the reference optical axis AX. Furthermore, both the first and second optical path folding mirrors M1 and M2 have plane reflection surfaces and are monolithically constituted as one optical member (one optical path folding mirror) having two reflection surfaces. The intersection of these two reflection surfaces (precisely, intersection of virtual extended surfaces thereof) is set so as to cross with AX1 of the first image-forming optical system G1, AX2 of the second imagine optical system G2, and AX3 of the third image-forming optical system G3 at one point. In the example, both the first and second optical path folding mirrors M1 and M2 are constituted as surface reflection mirrors.

In the example, fluorite ($CaF_2$ crystal) is used for all the refractive optical members (lens components) constituting the projection optical system PL. Moreover, the oscillation center wavelength of $F_2$ laser light, which is exposure light, is 157.6244 nm. In the vicinity of 157.6244 nm, the refractive index of $CaF_2$ varies at a rate of $-2.6 \times 10^{-6}$ for a wavelength change of +1 pm and varies at a rate of $+2.6 \times 10^{-6}$ for a wavelength change of −1 pm.

In other words, in the vicinity of 157.6244 nm, the dispersion of the refractive index (dn/dλ) of $CaF_2$ is $2.6 \times 10^{-6}$/pm.

Therefore, in the example, the refractive index of $CaF_2$ for the center wavelength 157.6244 nm is 1.55930666, the refractive index of $CaF_2$ for 157.6244 nm+1 pm=157.6254 nm is 1.55930406, and the refractive index of $CaF_2$ for 157.6244 nm−1 pm=157.6234 nm is 1.55930926.

Moreover, in the example, an aspherical surface is represented by the expression (a) below:

$$z = (y^2/r)/[1 + \{1 - (1+\kappa) \cdot y^2/r^2\}^{1/2}] + \\ C_4 \cdot y^4 + C_6 \cdot y^6 + C_8 \cdot y^8 + C_{10} \cdot y^{10} + \\ C_{12} \cdot y^{12} + C_{14} \cdot y^{14} \tag{a}$$

where the height in the perpendicular direction to the optical axis is denoted by y, the distance (sag (deviation) amount) from the tangent plane of the aspherical surface at the vertex to the position on the aspherical surface at the height y along the optical axis is denoted by z, the vertex radius of curvature is denoted by r, the conic coefficient is denoted by κ, and the n-th aspheric coefficient is denoted by Cn. In the example, asterisks * are added on the right sides of the surface numbers of lens surfaces formed in an aspherical shape.

Figure 12:
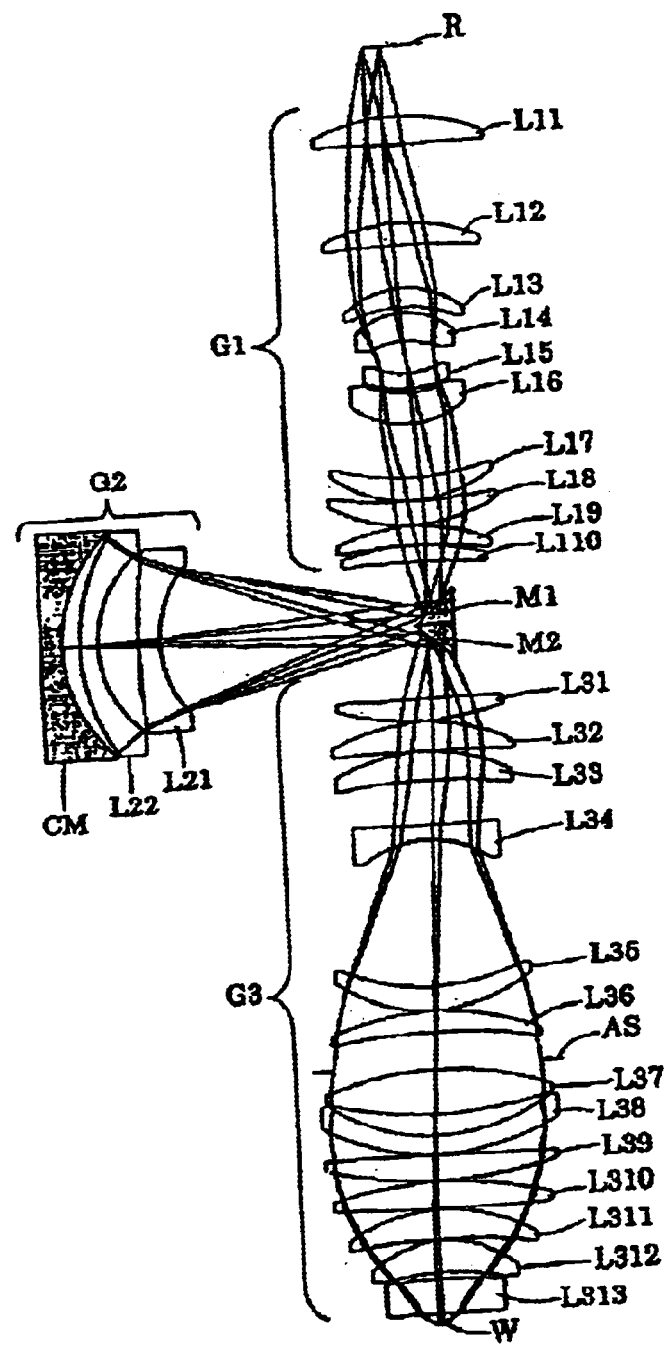
FIG. 12 is a view showing the lens configuration of a projection optical system according to an example of the present embodiment.

FIG. 12 is a view showing the lens configuration of the projection optical system according to the example of the present embodiment. Referring to FIG. 12, in the projection optical system PL according to the example, the first image-forming optical system G1 comprises, from the reticle side, a double-convex lens L11, a positive meniscus lens L12 having an aspherical concave surface oriented toward the wafer side, a positive meniscus lens L13 having a convex surface oriented toward the reticle side, a positive meniscus lens L14 having a convex surface oriented toward the reticle side, a negative meniscus lens L15 having a concave surface oriented toward the reticle side, a positive meniscus lens L16 having a concave surface oriented toward the reticle side, a positive meniscus lens L17 having an aspherical concave surface oriented toward the reticle side, a positive meniscus lens L18 having a concave surface oriented toward the reticle side, a double-convex lens L19, and a positive meniscus lens L110 having an aspherical concave surface oriented toward the wafer side.

Moreover, the second image-forming optical system G2 comprises, from the reticle side (i.e., incident side) along the light traveling route, a negative meniscus lens L21 having an aspherical convex surface oriented toward the reticle side, a negative meniscus lens L22 having a concave surface oriented toward the reticle side, and a concave reflection mirror CM.

Furthermore, the third image-forming optical system G3 comprises, from the reticle side along the light traveling direction, a positive meniscus lens L31 having a concave surface oriented toward the reticle side, a double-convex lens L32, a positive meniscus lens L33 having an aspherical concave surface oriented toward the wafer side, a double-concave lens L34, a positive meniscus lens L35 having an aspherical concave surface oriented toward the reticle side, a positive meniscus lens L36 having an aspherical concave surface oriented toward the wafer side, an aperture stop AS, a double-convex lens L37, a negative meniscus lens L38 having a concave surface oriented toward the reticle side, a double-convex lens L39, a positive meniscus lens L310 having a convex surface oriented toward the reticle side, a positive meniscus lens L311 having an aspherical concave surface oriented toward the wafer side, a positive meniscus lens L312 having a convex surface oriented toward the reticle side, a planoconvex lens L313 having a plane oriented toward the wafer side.

In the table 1 below, the values of the specifications for the projection optical system PL according to the example are listed. In the table 1, λ represents the center wavelength of exposure light, β represents the projection magnification (image-forming magnification of the whole system), NA represents the numerical aperture on the image side (wafer side), B is the radius of the image circle IF on the wafer W, A is the off-axis amount of the effective exposure area ER, LX represents the dimension of the effective exposure area ER along the X direction (long side dimension), and LY represents the dimension of the effective exposure area ER along the Y direction.

Moreover, a surface number represents the order of a surface from the reticle side along the light traveling direction from the reticle plane which is the object plane (first surface) to the wafer surface which is the image plane (surface) (second surface), r is the radius of curvature of each surface (vertex radius of curvature in the case of aspherical surface: mm), d is the on-axis (axial) interval, that is, surface interval (mm) for each surface, (C·D) represents the crystal axis C coinciding with the optical axis and the angular position D of other specific crystal axis in each fluorite lens, ED represents the clear aperture diameter (mm) of each surface, LD represents the outside diameter (mm) of each surface, ET represents the edge thickness of each lens, and n represents the refractive index for the center wavelength.

Here, the sign of the surface interval d changes for each reflection. Therefore, the sign of the surface interval d is defined as negative in the optical path from the reflection surface of the first optical path folding mirror M1 to the concave reflection mirror CM and in the optical path from the reflection surface of the second optical path folding mirror M2 to the image plane, and is defined as positive in the other optical paths. In addition, in the first image-forming optical system G1, the radius of curvature for a surface convex toward the reticle side is defined as positive, and the radius of curvature for a surface concave toward the reticle side is defined as negative. On the other hand, in the third image-forming optical system G3, the radius of curvature for a surface concave toward the reticle side is defined as positive, and the radius of curvature for a surface convex toward the reticle side is defined as negative. Furthermore, in the second image-forming system G2, the radius of curvature for a surface concave toward the reticle side (i.e., incident side) along the light traveling route is defined as positive, and the radius of curvature for a surface convex toward the reticle side is defined as negative.

Moreover, when the crystal axis C is the crystal axis [111], the angular position D is, for example, the angle of the crystal axis [−111] to a reference orientation. When the crystal axis C is the crystal axis [100], the angular position D is, for example, the angle of the crystal axis [010] to the reference orientation. Here, the reference orientation is defined, for example, so as to optically correspond to an orientation arbitrarily set so as to pass through the optical axis AX1 in the reticle plane. To be more precise, when the reference orientation is set along the +Y direction in the reticle plane, the reference orientation in the first image-forming optical system G1 is the +Y direction. In this case, the reference orientation in the second image-forming optical system G2 is the +Z direction (direction optically corresponding to the +Y direction in the reticle plane), and the reference direction in the third image-forming optical system G3 is the −Y direction (direction optically corresponding to the +Y direction in the reticle plane).

According, for example, (C·D)=(100·0) means that, in a fluorite lens having the optical axis coinciding with the crystal axis [100], the crystal axis [010] is located along the reference orientation. Meanwhile, (C·D)=(100·45) means that, in a fluorite lens having the optical axis coinciding with the crystal axis [100], the crystal axis [010] is located so as to form 45° to the reference orientation. Therefore, a fluorite lens of (C·D)=(100·0) and a fluorite lens of (C·D)=(100·45) collectively constitute a lens pair of crystal axis [100].

Moreover, for example, (C·D)=(111·0) means that, in a fluorite lens having the optical axis coinciding with the crystal axis [111], the crystal axis [−111] is located along the reference orientation. Meanwhile, (C·D)=(111·60) means that, in a fluorite lens having the optical axis coinciding with the crystal axis [111], the crystal axis [−111] is located so as to form 60° with respect to the reference orientation. Therefore, a fluorite lens of (C·D)=(111·0) and a fluorite lens of (C·D)=(111·60) collectively constitute a lens pair of crystal axis [111].

Incidentally, in the above description of the angular position D, it is unnecessary for the definition of the reference orientation to be common to all the lenses, and it is sufficient that the definition of the reference orientation is common to, for example, each lens pair. Moreover, a specific crystal axis to be a subject of angle measurement with respect to the reference orientation is not limited to the crystal axis [010] in the case of a lens pair of the crystal axis [100] or to the crystal axis [−111] in the case of a lens pair of the crystal axis [111]. The specific crystal axis can be set appropriately, for example, for each lens pair. Note that the same notation in the table 1 is applied to the table 2 mentioned later.

TABLE 1

| Surface No. (Reticle Plane) | r 103.3533 | d | (C·D) | ED | LD | ET | n | |
|---|---|---|---|---|---|---|---|---|
| 1 | 374.9539 | 27.7555 | (100-45) | 163.8 | 190.0 | 7.3 | 1.559307 | (L11) |
| 2 | −511.3218 | 2.0000 | | 165.0 | | | | |
| 3 | 129.8511 | 41.0924 | (100-0) | 164.3 | 191.3 | 10.8 | 1.559307 | (L12) |
| 4* | 611.8828 | 20.1917 | | 154.3 | | | | |
| 5 | 93.6033 | 29.7405 | (100-45) | 128.2 | 153.2 | 14.9 | 1.559307 | (L13) |
| 6 | 121.8341 | 16.0140 | | 110.0 | | | | |
| 7 | 83.6739 | 21.7064 | (111-0) | 92.3 | 117.3 | 17.3 | 1.559307 | (L14) |
| 8 | 86.7924 | 42.9146 | | 73.8 | | | | |
| 9 | −112.0225 | 15.4381 | (100-0) | 71.1 | 111.8 | 19.2 | 1.559307 | (L15) |
| 10 | −183.1783 | 9.7278 | | 86.8 | | | | |
| 11 | −103.9725 | 24.6160 | (111-0) | 92.2 | 133.7 | 10.3 | 1.559307 | (L16) |
| 12 | −79.4102 | 26.3046 | | 108.7 | | | | |
| 13* | −166.4447 | 35.1025 | (111-60) | 137.8 | 179.4 | 17.3 | 1.559307 | (L17) |
| 14 | −112.7568 | 1.0007 | | 154.4 | | | | |
| 15 | −230.1701 | 28.4723 | (111-60) | 161.5 | 193.4 | 7.1 | 1.559307 | (L18) |
| 16 | −132.8952 | 1.0000 | | 168.4 | | | | |
| 17 | 268.5193 | 29.4927 | (100-45) | 167.1 | 192.1 | 5.7 | 1.559307 | (L19) |
| 18 | −678.1883 | 1.0000 | | 164.3 | | | | |
| 19 | 155.2435 | 26.5993 | (100-45) | 150.3 | 176.9 | 11.6 | 1.559307 | (L110) |
| 20* | 454.2151 | 61.5885 | | 139.9 | | | | |
| 21 | ∞ | 235.9300 | | | | | | (M1) |
| 22* | 140.0521 | −22.7399 | (111-60) | 124.5 | 187.0 | 47.5 | 1.559307 | (L21) |
| 23 | 760.9298 | −44.1777 | 146.1 | | | | | |
| 24 | 109.3587 | −16.0831 | (111-0) | 159.6 | 234.4 | 36.0 | 1.559307 | (L22) |
| 25 | 269.5002 | 22.7995 | | 207.8 | | | | |
| 26 | 159.8269 | 22.7995 | | 213.7 | | | | (CM) |
| 27 | 269.5002 | 16.0831 | (111-0) | 209.4 | 234.4 | 36.0 | 1.559307 | (L22) |
| 28 | 109.3587 | 44.1777 | | 168.2 | | | | |
| 29 | 760.9298 | 22.7399 | (111-60) | 162.0 | 187.0 | 47.5 | 1.559307 | (L21) |
| 30* | 140.0521 | 238.9300 | | 143.2 | | | | |
| 31 | ∞ | −67.1481 | | | | | | (M2) |
| 32 | 2064.4076 | −20.4539 | (100-0) | 154.9 | 185.0 | 6.1 | 1.559307 | (L31) |
| 33 | 264.1465 | −1.1124 | | 160.0 | | | | |

TABLE 1-continued

| | | | | | | | |
|---|---|---|---|---|---|---|---|
| 34 | 236.9696 | 36.6315 | (111-0) | 174.4 | 199.4 | 6.5 | 1.559307 (L32) |
| 35 | 548.0272 | −14.7708 | | 174.4 | | | |
| 36 | −261.5738 | 23.7365 | (111-60) | 167.9 | 199.5 | 13.1 | 1.559307 (L33) |
| 37* | −953.3646 | 162.5000 | | | | | |
| 38 | 192.9421 | −16.1495 | (111-0) | 127.7 | 153.7 | 47.4 | 1.559307 (L34) |
| 39 | −139.0423 | −71.8678 | | 128.7 | | | |
| 40* | 1250.0000 | −43.1622 | (100-45) | 165.7 | 205.1 | 21.9 | 1.559307 (L35) |
| 41 | 185.8787 | −1.0000 | | 180.1 | | | |
| 42 | −206.0962 | 27.6761 | (111-0) | 195.0 | 228.8 | 13.6 | 1.559307 (L36) |
| 43* | −429.3688 | −30.3562 | | 191.8 | | | |
| 44 | ∞ | −4.0000 | | 196.8 | (AS) | | |
| 45 | −1246.9477 | −40.5346 | (111-60) | 199.6 | 227.5 | 6.2 | 1.559307 (L37) |
| 46 | 229.5046 | −19.2328 | | 202.5 | | | |
| 47 | 153.1781 | −18.0000 | (100-0) | 201.4 | 238.1 | 22.1 | 1.559307 (L38) |
| 48 | 200.0000 | −1.0000 | | 213.1 | | | |
| 49 | −1605.7826 | −25.8430 | (111-0) | 215.0 | 240.0 | 7.1 | 1.559307 (L39) |
| 50 | 497.7325 | −1.0000 | | 214.9 | | | |
| 51 | −232.1186 | −31.8757 | (111-0) | 204.9 | 229.9 | 8.3 | 1.559307 (L310) |
| 52 | −993.7015 | −1.0000 | | 198.1 | | | |
| 53 | −142.9632 | −44.5398 | (100-45) | 178.7 | 203.7 | 9.2 | 1.559307 (L311) |
| 54* | −3039.5137 | −3.0947 | | 162.7 | | | |
| 55 | −139.2455 | −27.2564 | (111-60) | 134.5 | 159.5 | 8.2 | 1.559307 (L312) |
| 56 | −553.1425 | −4.2798 | | 116.2 | | | |
| 57 | −1957.7823 | −37.0461 | (1000) | 110.3 | 135.3 | 35.9 | 1.559307 (L313) |
| 58 | ∞ | 11.0000 | | 63.6 | | | |

(Wafer Plane)

(Aspherical Surface Data)

Figure 13:
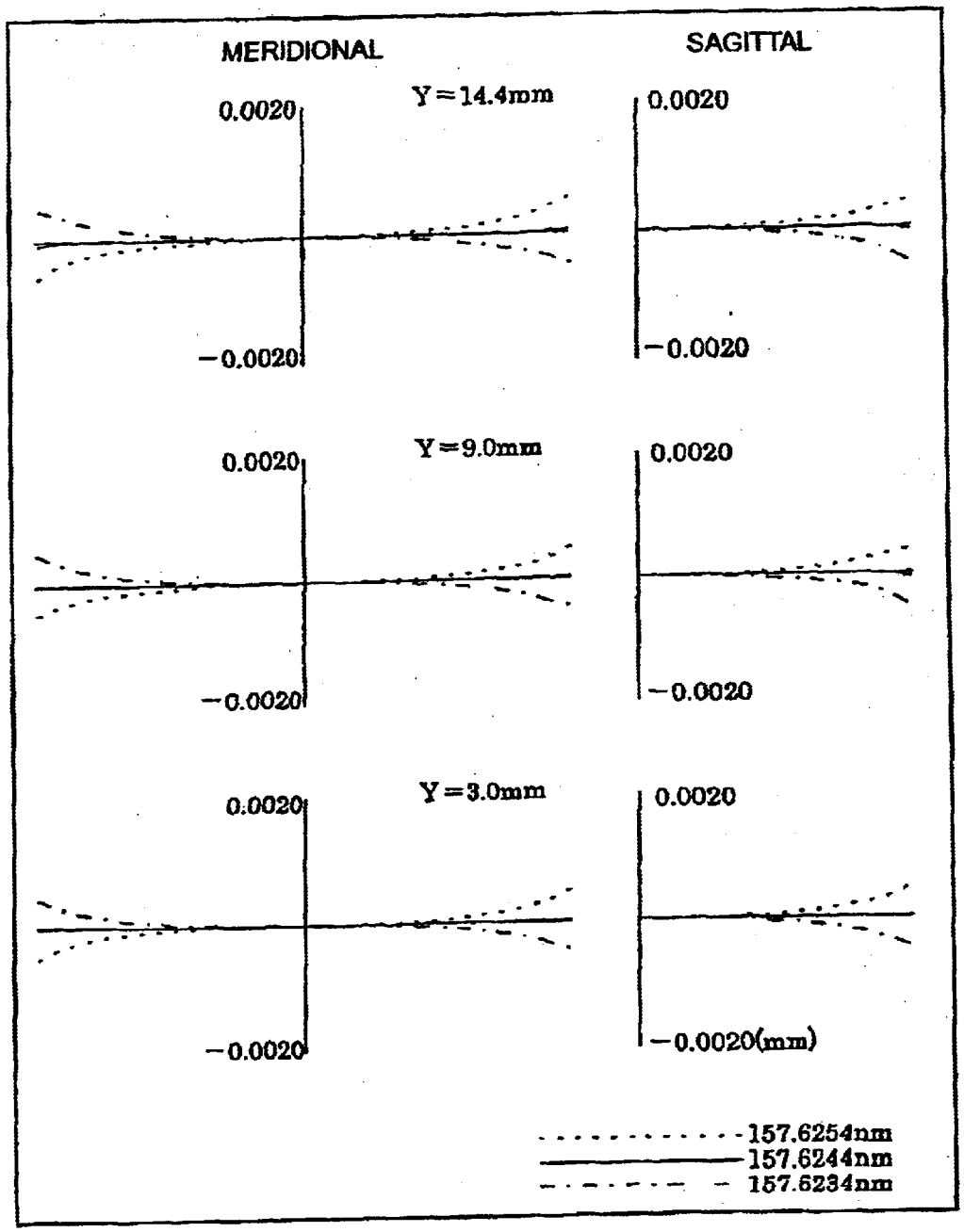
FIG. 13 contains charts showing transverse aberration in the example of the present invention.

4th Surface
$K = 0$ $C_4 = 4.21666 \times 10^{-8}$
$C_8 = 5.29072 \times 10^{-17}$
$C_{12} = 1.32134 \times 10^{-26}$ $C_6 = -1.01888 \times 10^{-12}$
$C_{10} = -3.39570 \times 10^{-21}$
$C_{14} = 7.93780 \times 10^{-30}$ 13th Surface
$k = 0$ $C_4 = 4.18420 \times 10^{-8}$
$C_8 = -2.47055 \times 10^{-16}$
$C_{12} = 31\ 3.51046 \times 10^{-24}$ $C_6 = -4.00795 \times 10^{-12}$
$C_{10} = 4.90976 \times 10^{-20}$
$C_{14} = 1.02968 \times 10^{-28}$ 20th Surface
$K = 0$ $C_4 = 6.37212 \times 10^{-8}$
$C_8 = 3.90077 \times 10^{-17}$
$C_{12} = -5.11335 \times 10^{-25}$ $C_6 = -1.22343 \times 10^{-12}$
$C_{10} = 2.04618 \times 10^{-21}$
$C_{14} = 3.76884 \times 10^{-29}$ 22nd and 30th Surfaces (Identical Surfaces)
$K = 0$ $C_4 = -6.69423 \times 10^{-8}$
$C_8 = 2.85906 \times 10^{-17}$
$C_{12} = 1.42191 \times 10^{-26}$ $C_6 = -1.77134 \times 10^{-14}$
$C_{10} = 8.86068 \times 10^{-21}$
$C_{14} = 6.36242 \times 10^{-29}$ 37th Surface
$K = 0$ $C_4 = -2.34854 \times 10^{-8}$
$C_8 = -1.45752 \times 10^{-17}$
$C_{12} = 1.94350 \times 10^{-26}$ $C_6 = -3.60542 \times 1^{-13}$
$C_{10} = -1.33699 \times 10^{-21}$
$C_{14} = -1.21690 \times 10^{-29}$ 40th Surface
$K = 0$ $C_4 = 5.39302 \times 10^{-8}$
$C_8 = -1.47196 \times 10^{-17}$
$C_{12} = 0$ $C_6 = -7.58468 \times 10^{-13}$
$C_{10} = -1.32017 \times 10^{-21}$
$C_{14} = 0$ 43rd Surface
$K = 0$ $C_4 = -2.36659 \times 10^{-8}$
$C_8 = 2.16318 \times 10^{-18}$
$C_{12} = -1.95020 \times 10^{-26}$ $C_6 = -4.34705 \times 10^{-13}$
$C_{10} = 9.11326 \times 10^{-22}$
$C_{14} = 0$ 54th Surface
$K = 0$ $C_4 = -3.78066 \times 10^{-8}$
$C_8 = 3.38936 \times 10^{-17}$
$C_{12} = 4.14101 \times 10^{-25}$ $C_6 = -3.03038 \times 10^{-13}$
$C_{10} = -6.41494 \times 10^{-21}$
$C_{14} = -1.40129 \times 10^{-29}$ FIG. 13 contains charts showing transverse aberration in the above-described example. In the aberration charts, Y represents the image height, the solid lines indicate the case of the center wavelength of 157.6244 nm, the broken lines indicate 157.6244 nm+1 pm=157.6254 nm, and the dashed dotted lines correspond to the case of 157.6244 nm −1 pm=157.6234 nm. As apparent from the aberration charts of FIG. 13, it is clear that, in the present example, though relatively large image-side numerical aperture (NA=0.85) and projection visual field (clear aperture diameter =28.8 mm) are ensured, chromatic aberration is favorably corrected for exposure light having a wavelength width of 157.6244 nm ±1 pm.

As described above, in the present example, an image side NA of 0.85 can be ensured for $F_2$ laser light having a center wavelength of 157.6244 nm, and an image circle having an clear aperture diameter of 28.8 mm where various aberrations including chromatic aberration are sufficiently corrected can be ensured on a wafer W. Therefore, a high resolution of 0.1 μm or less can be achieved under the conditions where a rectangular effective exposure area having a sufficiently large size of 25 mm×4 mm is ensured.

Moreover, in the present example, since the clear aperture diameters relative to the outside diameters of lens components in the projection optical system is defined within an appropriate range, it is possible to realize both improvement in the image-forming performance of the projection optical system and reduction in costs.

In the exposure system of the above-described embodiment, a reticle (mask) is illuminated by the illumination device (illumination step), and a pattern to be transferred which is formed on the mask is exposed on a photosensitive substrate using the projection optical system (exposure step), whereby microdevices (semiconductor devices, image pickup devices, liquid crystal display devices, thin film magnetic heads, and the like) can be manufactured. Hereinafter, referring to the flowchart in FIG. 14, a description is given for an example of a method for obtaining semiconductor devices serving as microdevices by forming a predetermined circuit pattern on wafers or the like used as photosensitive substrates using the exposure system of the present embodiment.

Figure 14:
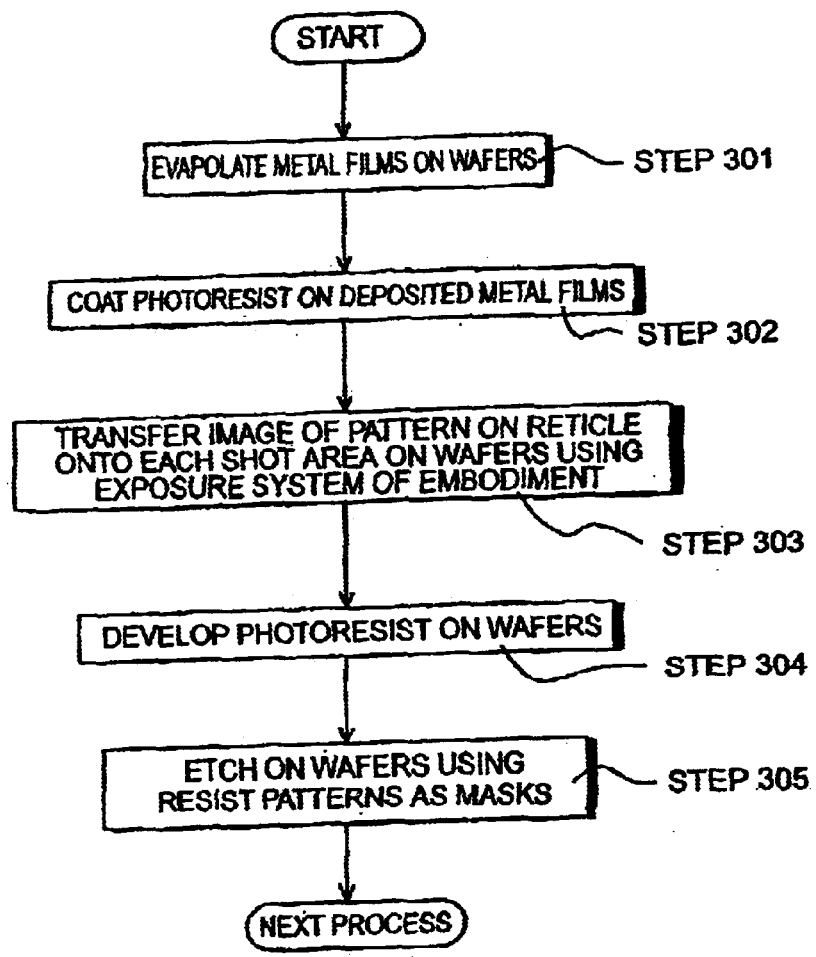
FIG. 14 is a flowchart for a method of obtaining semiconductor devices as microdevices.

First, at Step 301 in FIG. 14, metal films are evaporated on wafers in one lot. At the next Step 302, photoresist is applied on the metal films on the wafers in the one lot. Thereafter, at Step 303, using the exposure system of the present embodiment, an image of a pattern on a mask is sequentially exposed and transferred to each shot area on the wafers in the one lot through the projection optical system. Thereafter, the photoresist on the wafers in the one lot is developed at Step 304, and then etching serving as a mask is performed on the wafers W in the one lot using the resist patterns as masks at Step 305, whereby a circuit pattern corresponding to the pattern on the mask is formed in each shot area on each wafer.

Then, the formation and the like of circuit patterns in further upper layers are performed, thereby manufacturing devices such as semiconductor devices. According to the above-described semiconductor device manufacturing method, semiconductor devices having very fine circuit patterns can be obtained with high throughput. Incidentally, at Steps 301 to 305, processes including deposition of metal on wafers, applying of resist on the metal films, exposure, development and etching are performed. As a matter of course, prior to these steps, after forming silicon oxide films on wafers, steps including coating resist on the silicon oxide films, exposure, development, etching, and the like may be performed.

Figure 15:
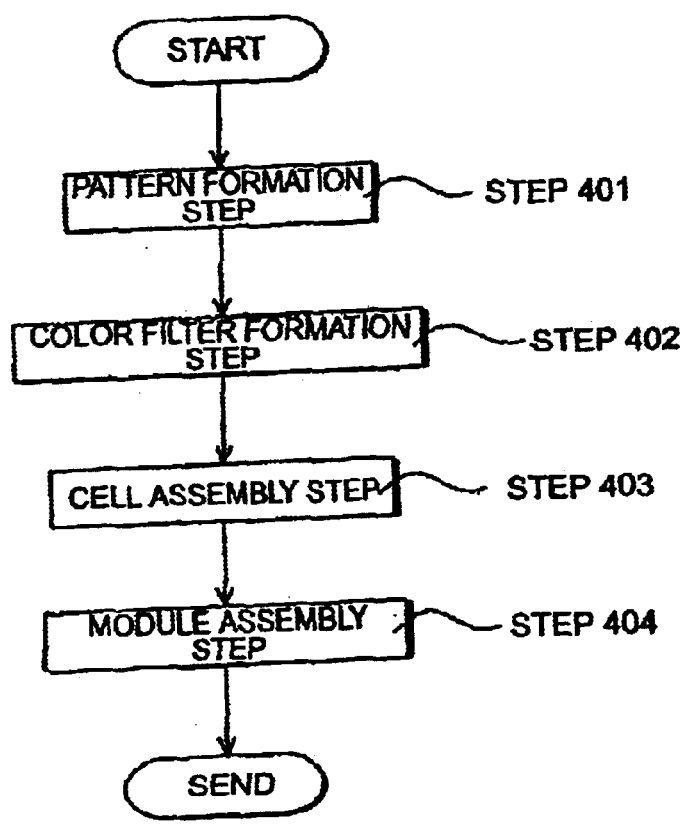
FIG. 15 is a flowchart for a method of obtaining a liquid crystal display device as a microdevice.

Moreover, in the exposure system of the present embodiment, a liquid crystal display device serving as a microdevice can be also obtained by forming a predetermined pattern (circuit pattern, electrode pattern, or the like) on a plate (glass substrate). Hereinafter, referring to the flowchart of FIG. 15, an example of a method in this case is described. In FIG. 15, at the pattern formation step 401, a so-called photolithography process, in which a pattern of a mask is transferred and exposed on a photosensitive substrate (glass substrate or the like having resist applied thereon), is performed using the exposure system of the present embodiment. By this photolithography process, a predetermined pattern including many electrodes and the like is formed on the photosensitive substrate. Thereafter, the exposed substrate undergoes steps including a development step, an etching step, a resist removal step, and the like, whereby the predetermined pattern is formed on the substrate, and the step goes to the next color filter formation step 402.

Next, at the color filter formation step 402, a color filter in which many groups each including three dots corresponding to R (red), G (green), and B (blue) are arranged in the form of a matrix or in which a plurality of groups each including three stripes of R, G, and B are arranged in the direction of horizontal scanning lines, is formed. Then, after the color filter formation step 402, a cell assembly step 403 is performed. At the cell assembly step 403, a liquid crystal panel (liquid crystal cell) is assembled using the substrate which has the predetermined pattern and which has been obtained at the pattern formation step 401, the color filter obtained at the color filter formation step 402 and the like. At the cell assembly step 403, a liquid crystal panel (liquid crystal cell) is manufactured, for example, by injecting liquid crystals between the color filter obtained at the color filter formation step 402 and the substrate which has the predetermined pattern and which has been obtained at the pattern formation step 401.

Thereafter, parts including an electric circuit for display operations of the assembled liquid crystal panel (liquid crystal cell), backlight and the like are attached at a module assembly step 404, thus forming a liquid crystal display device. According to the above-described liquid crystal display device manufacturing method, a liquid crystal display device having a very fine circuit pattern can be obtained with high throughput.

Incidentally, in the above-described embodiment, the present invention is applied to a projection optical system incorporated in an exposure system. However, the present invention is not limited to this, and can be also applied to other general projection optical system (image-forming optical system). In addition, the magnification of this projection (image-forming) optical system is not limited to a reduced magnification and may be an unit magnification or an enlarged magnification.

Moreover, in the above-described embodiment, the present invention is applied to a projection optical system of a catadioptric type. However, the present invention may be applied to a projection optical system of a refractive type.

Also, in the above-described embodiment, a $F_2$ laser light source is used, but a light source is not limited to this. For example, other appropriate light source for supplying light having a wavelength of 200 nm or less can be used.

Further, in the above-described embodiment, the present invention is applied to an exposure system of a step-and-scan type, which scans and exposes a mask pattern for each exposure area of a substrate while moving a mask and the substrate relative to a projection optical system. However, the present invention is not limited to this and can be applied to an exposure system of a step-and-repeat type (a batch exposure type), which transfers a whole pattern of a mask on a substrate at once in the state where the mask and the substrate are stayed and which sequentially steps to each exposure area by moving the substrate to sequentially expose the mask pattern therein.

Furthermore, in the above-described embodiment, an aperture stop is disposed in the third image-forming optical system. However, an aperture stop may be disposed in the first image-forming optical system. In addition, a field stop may be disposed at least one of the intermediate image position between the first and second image-forming optical systems and the intermediate image position between the second and third image-forming optical systems.

As described above, in the projection optical system of the present invention, though optical material, such as fluorite, having intrinsic birefringence is used, favorable optical performances can be achieved practically without an influence of birefringence. Moreover, in the exposure system and the method of the present invention, projection and exposure with high resolution and precision can be performed using the projection optical system of the present invention, which has favorable optical performances without being practically influenced by birefringence. In addition, a favorable microdevice can be manufactured with high precision projection and exposure through a projection optical system having a high resolution by using the exposure system incorporating the projection optical system of the present invention.

The basic Japanese Application No.125506/2002 filed on Apr. 26, 2002 is hereby incorporated by reference.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A projection optical system which includes a plurality of light-transmissive members and which projects an image of a first surface onto a second surface, the projection optical system comprising:
   a light-transmissive crystal member made of crystal material,
   wherein at least one of the light-transmissive crystal members satisfies $$0.3 < ED/LD < 0.95$$

when an clear aperture diameter of the light-transmissive crystal member is denoted by ED and an outside diameter of the light-transmissive crystal member is denoted by LD.

2. The projection optical system according to claim 1, wherein the light-transmissive crystal member is made of crystal material belonging to a cubic system and is formed such that an optical axis and any one of crystal axes [100] and [110] of the light-transmissive crystal member approximately coincide.

3. The projection optical system according to claim 2, wherein the light-transmissive crystal member is made of fluorite and is formed such that an optical axis and a crystal axis [100] of the light-transmissive crystal member approximately coincide.

4. The projection optical system according to claim 3, wherein an edge thickness of the light-transmissive crystal member is 5 mm or more at the outside diameter.

5. The projection optical system according to claim 1, wherein an edge thickness of the light-transmissive crystal member is 5 mm or more at the outside diameter.

6. An exposure system, comprising:
   an illumination system for illuminating a mask set in the first surface; and
   the projection optical system according to claim 1, for forming an image of a pattern formed on the mask onto a photosensitive substrate set in the second surface.

7. A method of exposure, comprising:
   illuminating a mask set in the first surface; and
   projecting and exposing an image of a pattern formed on the mask onto a photosensitive substrate set in the second surface through the projection optical system according to claim 1.

8. A projection optical system which includes a plurality of light-transmissive members and which projects an image of a first surface onto a second surface, the projection optical system comprising:
   a fluorite member formed of fluorite in such a manner that an optical axis and a crystal axis [100] of the fluorite member approximately coincide,
   wherein the outside diameters XD and D1 satisfy $$0.1 < D1/XD < 0.8$$

where an outside diameter of the light-transmissive member having a maximum outside diameter, among all the light-transmissive members included in the projection optical system, is denoted by XD and an outside diameter of the fluorite member having a maximum outside diameter, among the fluorite members, is denoted by D1.

9. An exposure system, comprising:
   an illumination system for illuminating a mask set in the first surface; and
   the projection optical system according to claim 8, for forming an image of a pattern formed on the mask onto a photosensitive substrate set in the second surface.

10. A method of exposure, comprising:
    illuminating a mask set in the first surface; and
    projecting and exposing an image of a pattern formed on the mask onto a photosensitive substrate set in the second surface through the projection optical system according to claim 8.

11. A projection optical system which includes a plurality of light-transmissive members and which projects an image of a first surface onto a second surface, the projection optical system comprising:
    a fluorite member formed of fluorite in such a manner that an optical axis and a crystal axis [110] of the fluorite member approximately coincide,
    wherein the outside diameters XD and D2 satisfy $$0.1 < D2/XD < 0.8$$

where an outside diameter of the light-transmissive member having a maximum outside diameter, among all the light-transmissive members included in the projection optical system, is denoted by XD and an outside diameter of the fluorite member having a maximum outside diameter, among the fluorite members, is denoted by D2.

12. An exposure system, comprising:
    an illumination system for illuminating a mask set in the first surface; and
    the projection optical system according to claim 11, for forming an image of a pattern formed on the mask onto a photosensitive substrate set in the second surface.

13. A method of exposure, comprising:
    illuminating a mask set in the first surface; and
    projecting and exposing an image of a pattern formed on the mask onto a photosensitive substrate set in the second surface through the projection optical system according to claim 11.

14. A projection optical system which includes a plurality of light-transmissive members and which projects an image of a first surface onto a second surface, the projection optical system comprising:
    a fluorite member formed of fluorite in such a manner that an optical axis and a crystal axis [100] of the fluorite member approximately coincide,
    wherein, among the fluorite members, more than or equal to 70% of total number of all the fluorite members are located in vicinities of pupil positions of the projection optical system.

15. The projection optical system according to claim 14, wherein the fluorite members include:
    a first fluorite member formed such that an optical axis and a crystal axis [100] of the first fluorite member approximately coincide; and
    a second fluorite member formed such that an optical axis and a crystal axis [100] of the second fluorite member approximately coincide, and
    wherein the first and second fluorite members are positioned such that crystal axes different from the crystal axes [100] are relatively rotated by 45° about the optical axes.

16. A projection optical system according to claim 15, wherein at least one of the light-transmissive crystal members satisfies $0.3 < ED/LD < 0.95$ when an clear aperture diameter of the light-transmissive crystal member is denoted by ED and an outside diameter of the light-transmissive crystal member is denoted by LD.

17. A projection optical system according to claim 14, wherein at least one of the light-transmissive crystal members satisfies $0.3 < ED/LD < 0.95$ when an clear aperture diameter of the light-transmissive crystal member is denoted by ED and an outside diameter of the light-transmissive crystal member is denoted by LD.

18. The projection optical system according to claim 17, wherein an edge thickness of the light-transmissive crystal member is 5 mm or more at the outside diameter.

19. A projection optical system according to claim 14, wherein the outside diameters XD and D1 satisfy $0.1 < D1/XD < 0.8$ where an outside diameter of the light-transmissive member having a maximum outside diameter, among all the light-transmissive members included in the projection optical system, is denoted by XD and an outside diameter of the fluorite member having a maximum outside diameter, among the fluorite members, is denoted by D1.

20. A method of exposure, comprising:
    illuminating a mask set in the first surface; and
    projecting and exposing an image of a pattern formed on the mask onto a photosensitive substrate set in the second surface through the projection optical system according to claim 14.

21. An exposure system, comprising:
    an illumination system for illuminating a mask set in the first surface; and
    the projection optical system according to claim 14, for forming an image of a pattern formed on the mask onto a photosensitive substrate set in the second surface.

22. A projection optical system which includes a plurality of light-transmissive members and which projects an image of a first surface onto a second surface, the projection optical system comprising:
    a fluorite member formed of fluorite in such a manner that an optical axis and a crystal axis [110] of the fluorite member approximately coincide,
    wherein, among the fluorite members, more than or equal to 70% of total number of all the fluorite members are located in vicinities of pupil positions of the projection optical system.

23. The projection optical system according to claim 22, wherein the fluorite members includes:
    a first fluorite member formed such that an optical axis and a crystal axis [110] of the first fluorite member approximately coincide; and
    a second fluorite member formed such that an optical axis and a crystal axis [110] of the second fluorite member approximately coincide, and
    wherein the first and second fluorite members are positioned such that crystal axes different from the crystal axes [110] are relatively rotated by 90° about the optical axes.

24. An exposure system, comprising:
    an illumination system for illuminating a mask set in the first surface; and
    the projection optical system according to claim 22, for forming an image of a pattern formed on the mask onto a photosensitive substrate set in the second surface.

25. A method of exposure, comprising:
    illuminating a mask set in the first surface; and
    projecting and exposing an image of a pattern formed on the mask onto a photosensitive substrate set in the second surface through the projection optical system according to claim 22.

* * * * *